(12) United States Patent
Baik et al.

(10) Patent No.: US 11,903,231 B2
(45) Date of Patent: Feb. 13, 2024

(54) ELECTROLUMINESCENT DISPLAY DEVICE

(71) Applicant: LG Display Co., Ltd., Seoul (KR)

(72) Inventors: SeungMin Baik, Paju-si (KR); JiYeon Park, Paju-si (KR); Ho-Jin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/134,525

(22) Filed: Apr. 13, 2023

(65) Prior Publication Data

US 2023/0255049 A1    Aug. 10, 2023

Related U.S. Application Data

(62) Division of application No. 17/019,115, filed on Sep. 11, 2020, now Pat. No. 11,659,727.

(30) Foreign Application Priority Data

Sep. 30, 2019    (KR) .......................... 10-2019-0120492

(51) Int. Cl.
*H10K 50/18* (2023.01)
*H10K 50/16* (2023.01)
*H10K 50/13* (2023.01)
*H10K 50/17* (2023.01)
*H10K 50/856* (2023.01)
*H10K 50/858* (2023.01)
*H10K 59/12* (2023.01)
(Continued)

(52) U.S. Cl.
CPC .......... *H10K 50/18* (2023.02); *H10K 50/131* (2023.02); *H10K 50/16* (2023.02); *H10K 50/171* (2023.02); *H10K 50/856* (2023.02); *H10K 50/858* (2023.02); *H10K 59/12* (2023.02); *H10K 59/38* (2023.02)

(58) Field of Classification Search
CPC .... H10K 50/11; H10K 50/131; H10K 50/171; H10K 50/18; H10K 50/822; H10K 50/856; H10K 50/858; H10K 59/12; H10K 59/123; H10K 59/124; H10K 59/35; H10K 59/38
See application file for complete search history.

(56) References Cited

U.S. PATENT DOCUMENTS 9,245,932 B2    1/2016 Yoon et al.
9,859,354 B2    1/2018 Kang et al.
(Continued)

FOREIGN PATENT DOCUMENTS

KR    10-2015-0060296 A    6/2015
KR    10-2016-0130071 A    11/2016

*Primary Examiner* — Omar F Mojaddedi
(74) *Attorney, Agent, or Firm* — Fenwick & West LLP

(57) ABSTRACT

Disclosed is an electroluminescent display device including a first pixel including a first sub pixel configured to emit first colored light, a second sub pixel configured to emit second colored light, and a third sub pixel configured to emit third colored light, a first electrode in the first sub pixel, an emission layer on the first electrode, a second electrode on the emission layer, and a first charge blocking layer provided below the second electrode and configured to prevent a light emission in the emission layer, wherein the first electrode is electrically connected with a driving thin film transistor in a first contact area provided in the first sub pixel, and the first charge blocking layer is overlapped with the first contact area.

7 Claims, 20 Drawing Sheets

(51) Int. Cl.
 *H10K 59/38* (2023.01)
 *H10K 59/35* (2023.01)

(56) References Cited

U.S. PATENT DOCUMENTS

| | | | |
|---|---|---|---|
| 2013/0001612 A1* | 1/2013 | Lee | H10K 50/852 |
| | | | 257/40 |
| 2015/0144908 A1 | 5/2015 | Yoon et al. | |
| 2016/0322444 A1* | 11/2016 | Kang | H10K 50/865 |
| 2018/0277612 A1* | 9/2018 | Kim | H10K 50/844 |
| 2020/0357871 A1* | 11/2020 | Chung | H10K 50/865 |
| 2021/0036062 A1* | 2/2021 | Kim | H10K 50/865 |
| 2021/0036073 A1* | 2/2021 | Cho | H10K 59/126 |
| 2021/0327964 A1* | 10/2021 | Jeon | H10K 50/844 |

* cited by examiner

| Gray | Comparative example 1 | | | | Embodiment of the present disclosure | | | |
|---|---|---|---|---|---|---|---|---|
| | R | G | B | DCI [%] CIE1976 Overlap ratio | R | G | B | DCI [%] CIE1976 Overlap ratio |
| 15G | 0.039 | 0.010 | 0.27 | 19.8% | 0.039 | 0.010 | 0.17 | 59.1% |
| 31G | 0.032 | 0.010 | 0.11 | 51.5% | 0.028 | 0.009 | 0.06 | 83.3% |
| 63G | 0.022 | 0.007 | 0.07 | 61.1% | 0.022 | 0.007 | 0.02 | 87.8% |
| 127G | 0.007 | 0.004 | 0.03 | 70.8% | 0.007 | 0.003 | 0.01 | 90.2% |
| 191G | 0.004 | 0.001 | 0.02 | 73.0% | 0.002 | 0.001 | 0.00 | 90.6% |
| 255G | 0.000 | 0.000 | 0.00 | 77.3% | 0.000 | 0.000 | 0.00 | 91.0% |

US 11,903,231 B2

ELECTROLUMINESCENT DISPLAY DEVICE

CROSS-REFERENCE TO RELATED APPLICATIONS

This application is a divisional application of U.S. patent application Ser. No. 17/019,115, filed Sep. 11, 2020, which claims the benefit of Republic of Korea Patent Application No. 10-2019-0120492 filed on Sep. 30, 2019, all of which are hereby incorporated by reference as if fully set forth herein.

BACKGROUND

Field

The present disclosure relates to an electroluminescent display device, and more particularly, to an electroluminescent display device having an emission layer formed in a connected structure among neighboring sub pixels.

Discussion of the Related Art

An electroluminescent display device is provided in such a way that an emission layer is provided between an anode electrode and a cathode electrode, and the emission layer emits light by an electric field generated between the above two electrodes, to thereby display an image.

The emission layer may be formed of an organic material which emits light when an exciton is produced by a bond of an electron and a hole, and the exciton falls to a ground state from an excited state, or may be formed of an inorganic material such as quantum dot.

The emission layer may be configured to emit different colored light by each sub pixel, for example, red colored light, green colored light, and blue colored light, or may be configured to emit the same colored light by each sub pixel, for example, white colored light.

If the emission layer is formed in a connected structure among the neighboring sub pixels, it is possible to form the emission layer by a deposition process without an additional mask.

However, if the emission layer is formed in the connected structure among the neighboring sub pixels, charges in any one sub pixel may be transferred to the neighboring other sub pixels through the use of emission layer, which may cause a leakage current. Especially, if there is the leakage current, a color of light emitted from the boundary area between the neighboring sub pixels may be different from a color of light emitted from the sub pixel, whereby it may have a problem related with a deterioration of picture quality.

SUMMARY

The present disclosure has been made in view of the above problems, and it is an object of the present disclosure to provide an electroluminescent display device capable of reducing a deterioration of picture quality caused by a leakage current between neighboring sub pixels.

In accordance with an aspect of the present disclosure, the above and other objects can be accomplished by the provision of an electroluminescent display device comprising a first pixel including a first sub pixel configured to emit first colored light, a second sub pixel configured to emit second colored light, and a third sub pixel configured to emit third colored light, a first electrode in the first sub pixel, an emission layer on the first electrode, a second electrode on the emission layer, and a first charge blocking layer provided below the second electrode and configured to prevent a light emission in the emission layer, wherein the first electrode is electrically connected with a driving thin film transistor in a first contact area provided in the first sub pixel, and the first charge blocking layer is overlapped with the first contact area.

In accordance with another aspect of the present disclosure, there is provided an electroluminescent display device comprising a first pixel and a second pixel, wherein each of the first pixel and the second pixel includes a first sub pixel configured to emit first colored light, a second sub pixel configured to emit second colored light, and a third sub pixel configured to emit third colored light, a first electrode in each of the first sub pixel, the second sub pixel, and the third sub pixel, an emission layer on the first electrode, a second electrode on the emission layer, and a charge blocking layer including a first charge blocking layer provided in an area overlapped with the boundary area between the first sub pixel of the first pixel and the first sub pixel of the second pixel, a second charge blocking layer provided in an area overlapped with the boundary area between the second sub pixel of the first pixel and the second sub pixel of the second pixel, and a third charge blocking layer provided in an area overlapped with the boundary area between the third sub pixel of the first pixel and the third sub pixel of the second pixel.

BRIEF DESCRIPTION OF THE DRAWINGS

The above and other objects, features and other advantages of the present disclosure will be more clearly understood from the following detailed description taken in conjunction with the accompanying drawings.

DETAILED DESCRIPTION

Figure 1:
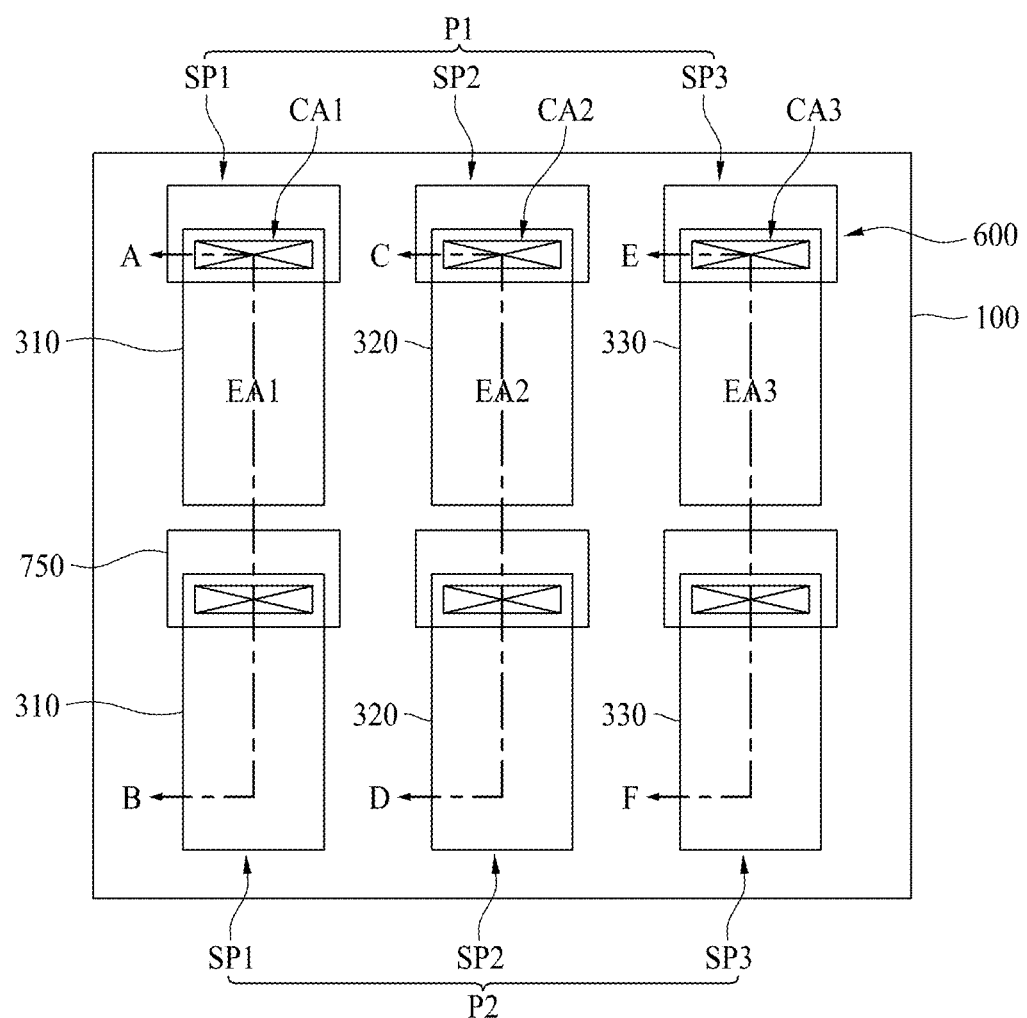
FIG. 1 is a schematic plan view illustrating an electroluminescent display device according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

Hereinafter, an electroluminescent display device according to the present disclosure will be described with reference to the accompanying drawings.

FIG. 1 is a schematic plan view illustrating an electroluminescent display device according to one embodiment of the present disclosure.

As shown in FIG. 1, the electroluminescent display device according to one embodiment of the present disclosure includes a substrate 100, a first electrode 310, 320 and 330, a bank 600, and a charge blocking layer 750.

On the substrate 100, there are a plurality of pixels (P1, P2). Each of the pixels (P1, P2) includes a plurality of sub pixels (SP1, SP2, SP3).

The plurality of pixels (P1, P2) may include a first pixel (P1) and a second pixel (P2) arranged in a first direction, for example, a vertical direction, but not limited to this structure. Also, each of the pixels (P1, P2) may include a first sub pixel (SP1) configured to emit first colored light, a second sub pixel (SP2) configured to emit second colored light, and a third sub pixel (SP3) configured to emit third colored light, wherein the first sub pixel (SP1), the second sub pixel (SP2), and the third sub pixel (SP3) are arranged in a second direction, which is different from the first direction, for example, a horizontal direction, but not limited to this structure.

The first sub pixel (SP1) of the first pixel (P1) and the first sub pixel (SP1) of the second pixel (P2) may be arranged in the same column and may be configured to emit the same colored light, for example, red colored light. The second sub pixel (SP2) of the first pixel (P1) and the second sub pixel (SP2) of the second pixel (P2) may be arranged in the same column and may be configured to emit the same colored light, for example, green colored light. The third sub pixel (SP3) of the first pixel (P1) and the third sub pixel (SP3) of the second pixel (P2) may be arranged in the same column and may be configured to emit the same colored light, for example, blue colored light. However, it is not limited to the above structure. The present disclosure has a structure in which two of the first sub pixels (SP1) configured to emit the same colored light are arranged adjacent to each other, two of the second sub pixels (SP2) configured to emit the same colored light are arranged adjacent to each other, and two of the third sub pixels (SP3) configured to emit the same colored light are arranged adjacent to each other.

The first electrode 310, 320, and 330 may be patterned by each individual sub pixel (SP1, SP2, SP3). That is, the first electrode 310 is provided in the first sub pixel (SP1) of each of the pixels (P1, P2), another first electrode 320 is provided in the second sub pixel (SP2) of each of the pixels (P1, P2), and the other first electrode 330 is provided in the third sub pixel (SP3) of each of the pixels (P1, P2). The first electrode 310, 320, and 330 may function as an anode of the electroluminescent display device.

The first electrode 310, 320, and 330 is electrically connected with a source terminal or a drain terminal of a driving thin film transistor via a contact area (CA1, CA2, CA3). Thus, the contact area (CA1, CA2, CA3) is overlapped with the first electrode 310, 320 and 330.

The contact area (CA1, CA2, CA3) includes a first contact area (CA1) provided in the first sub pixel (SP1) of each of the pixels (P1, P2), a second contact area (CA2) provided in the second sub pixel (SP2) of each of the pixels (P1, P2), and a third contact area (CA3) provided in the third sub pixel (SP3) of each of the pixels (P1, P2). The contact area (CA1, CA2, CA3) may be provided at one side of each individual sub pixel (SP1, SP2, SP3), for example, an upper side of each individual sub pixel (SP1, SP2, SP3), whereby the contact area (CA1, CA2, CA3) may be overlapped with an upper portion of each first electrode 310, 320, and 330.

Also, each individual sub pixel (SP1, SP2, SP3) may include an emission area (EA1, EA2, EA3). That is, a first emission area (EA1) is provided in the first sub pixel (SP1) of each of the pixels (P1, P2), a second emission area (EA2) is provided in the second sub pixel (SP2) of each of the pixels (P1, P2), and a third emission area (EA3) is provided in the third sub pixel (SP3) of each of the pixels (P1, P2).

The first emission area (EA1) is not overlapped with the first contact area (CA1), the second emission area (EA2) is not overlapped with the second contact area (CA2), and the third emission area (EA3) is not overlapped with the third contact area (CA3).

The bank 600 covers the edge of the first electrode 310, 320, and 330, and the bank 600 is formed in a matrix structure. That is, the bank 600 may be provided in the boundary area between each of the plurality of pixels (P1, P2, P3, P4) and the boundary area between each of the plurality of sub pixels (SP1, SP2, SP3). Also, the bank 600 is overlapped with the contact area (CA1, CA2, CA3). Thus, the emission area (EA1, EA2, EA3) may be defined by the bank 600. That is, an exposed portion of the first electrode 310, 320, and 330, which is exposed without being covered by the bank 600, forms the emission area (EA1, EA2, EA3).

The charge blocking layer 750 is overlapped with the bank 600. Also, the charge blocking layer 750 is overlapped with the contact area (CA1, CA2, CA3). Especially, the charge blocking layer 750 covers the entire contact area (CA1, CA2, CA3). The charge blocking layer 750 may include a material for blocking a transfer of a charge, and more particularly, a material for blocking a transfer of an electron. Accordingly, a light emission is not generated in the area overlapped with the charge blocking layer 750. As a result, a light emission is not generated in the contact area (CA1, CA2, CA3) overlapped with the charge blocking layer 750. If the emission layer extends to the contact area (CA1, CA2, CA3), a charge of the emission area (EA1, EA2, EA3) may flow into the contact area (CA1, CA2, CA3), whereby a light emission may be generated in the contact area (CA1, CA2, CA3). However, according to one embodiment of the present disclosure, the charge blocking layer 750 is overlapped with the contact area (CA1, CA2, CA3) so that it is possible to prevent a problem related with the light emission in the contact area (CA1, CA2, CA3).

One charge blocking layer 750 overlapped with the first contact area (CA1), another charge blocking layer 750 overlapped with the second contact area (CA2), and the other charge blocking layer 750 overlapped with the third contact area (CA3) are not brought into contact with each other.

Also, the charge blocking layer 750 may be additionally provided on an upper peripheral area of each pixel (P1, P2), and more particularly, the boundary area between the first pixel (P1) and the second pixel (P2). According as the charge blocking layer 750 is provided on the boundary area between the first pixel (P1) and the second pixel (P2), it is possible to prevent a deterioration of picture quality caused by a leakage current between the first pixel (P1) and the second pixel (P2) which are adjacent to each other. That is, the charge blocking layer 750 may be provided on the first boundary area between the first sub pixel (SP1) of the first pixel (P1) and the first sub pixel (SP1) of the second pixel (P2), the second boundary area between the second sub pixel (SP2) of the first pixel (P1) and the second sub pixel (SP2) of the second pixel (P2), and the third boundary area between the third sub pixel (SP3) of the first pixel (P1) and the third sub pixel (SP3) of the second pixel (P2).

The aforementioned one charge blocking layer 750 may extend from the first contact area (CA1) to the first boundary area, the aforementioned another charge blocking layer 750 may extend from the second contact area (CA2) to the second boundary area, and the aforementioned other charge blocking layer 750 may extend from the third contact area (CA3) to the third boundary area. In this case, the aforementioned one charge blocking layer 750, another charge blocking layer 750, and the other charge blocking layer 750 may be spaced apart from each other without being connected with each other.

Figure 2:
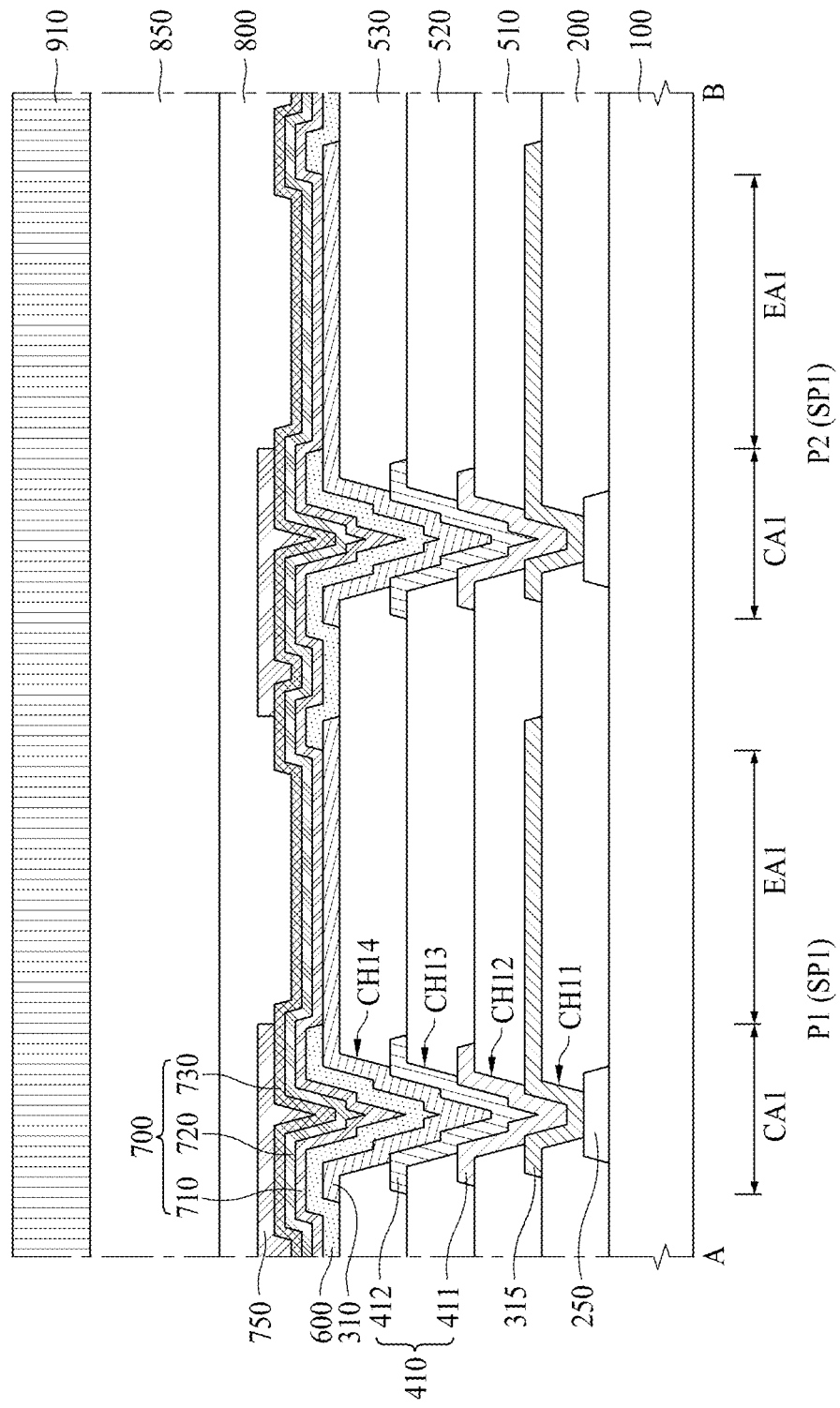
FIG. 2 is a schematic cross sectional view illustrating the electroluminescent display device according to one embodiment of the present disclosure, which is a cross sectional view along A-B line of FIG. 1.

FIG. 2 is a schematic cross sectional view illustrating the electroluminescent display device according to one embodiment of the present disclosure, which is a cross sectional view along A-B line of FIG. 1. That is, FIG. 2 shows a cross section of the first sub pixel (SP1) of the first pixel (P1), and a cross section of the first sub pixel (SP1) of the second pixel (P2).

As shown in FIG. 2, the electroluminescent display device according to one embodiment of the present disclosure includes the substrate 100, a circuit device layer 200, the first electrode 310, a first reflective plate 315, a first contact electrode 410, an insulating layer 510, 520, and 530, the bank 600, an emission layer 700, the charge blocking layer 750, the second electrode 800, an encapsulation layer 850, and a first color filter 910.

The substrate 100 may be formed of a glass or plastic material, but not limited to this material. The substrate 100 may be formed of a semiconductor material such as silicon wafer. The substrate 100 may be formed of a transparent material or an opaque material. If the electroluminescent display device according to one embodiment of the present disclosure is a top emission type where emitted light advances toward an upper side, the substrate 100 may be formed of the opaque material as well as the transparent material.

On the substrate 100, there are the first sub pixel (SP1) of the first pixel (P1) and the first sub pixel (SP1) of the second pixel (P2) which are adjacent to each other. The respective first sub pixels (SP1) of the respective pixels (P1, P2) may be configured to emit the same colored light, for example, red colored light.

The circuit device layer 200 is provided on the substrate 100. In the circuit device layer 200, a circuit device including various signal lines, thin film transistors, and a capacitor is provided in the first sub pixel (SP1) of each of the pixels (P1, P2). The signal lines may include a gate line, a data line, a power line, and a reference line, and the thin film transistors may include a switching thin film transistor, a driving thin film transistor 250, and a sensing thin film transistor.

According as the switching thin film transistor is switched in accordance with a gate signal supplied to the gate line, the switching thin film transistor supplies a data voltage, which is provided from the data line, to the driving thin film transistor.

According as the driving thin film transistor 250 is switched in accordance with the data voltage supplied from the switching thin film transistor, the driving thin film transistor 250 generates a data current by power supplied from the power line, and supplies the generated data current to the first electrode 310.

The sensing thin film transistor senses a threshold voltage deviation of the driving thin film transistor 250, which causes a deterioration of picture quality. In response to a sensing control signal supplied from the gate line or additional sensing line, the sensing thin film transistor supplies a current of the driving thin film transistor 250 to the reference line.

The capacitor maintains the data voltage supplied to the driving thin film transistor 250 for one frame period. The capacitor is connected with each of a gate terminal and a source terminal of the driving thin film transistor 250.

The circuit device layer 200 is provided with a first contact hole (CH11) by each first sub pixel (SP1), whereby the source terminal or drain terminal of the driving thin film transistor 250 is exposed via the first contact hole (CH11).

On the circuit device layer 200, and more particularly, on the insulating layer 510, 520, and 530, the first electrode 310 is patterned by each first sub pixel (SP1). The first electrode 310 extends from the first contact area (CA1) to the first emission area (EA1).

The first electrode 310 is electrically connected with the source terminal or drain terminal of the driving thin film transistor 250 provided in the circuit device layer 200. In detail, the first electrode 310 may be electrically connected with the source terminal or drain terminal of the driving thin film transistor 250 via the first contact electrode 410 and the first reflective plate 315. The first contact electrode 410 may include a first lower layer 411 and a first upper layer 412 provided in the first contact area (CA1).

The first reflective plate 315 is provided on the circuit device layer 200, and the first reflective plate 315 may be connected with the source terminal or drain terminal of the driving thin film transistor 250 via the first contact hole (CH11) provided in the circuit device layer 200. If needed, the first reflective plate 315 may be connected with the source terminal or drain terminal of the driving thin film transistor 250 through a conductive material filled in the first contact hole (CH11). The first reflective plate 315 extends from the first contact area (CA1) to the first emission area (EA1).

The first lower layer 411 of the first contact electrode 410 is provided on the first insulating layer 510, and the first lower layer 411 of the first contact electrode 410 may be connected with the first reflective plate 315 via a second contact hole (CH12) provided in the first insulating layer 510. The first upper layer 412 of the first contact electrode 410 is provided on the second insulating layer 520, and the first upper layer 412 of the first contact electrode 410 may be connected with the first lower layer 411 via a third contact hole (CH13) provided in the second insulating layer 520. The first electrode 310 is provided on the third insulating layer 530, and the first electrode 310 may be connected with the first upper layer 412 via a fourth contact hole (CH14) provided in the third insulating layer 530.

The first electrode 310 may be connected with the source terminal or drain terminal of the driving thin film transistor 250 via the first upper layer 412, the first lower layer 411, and the first reflective plate 315, but not limited to this structure. For example, the first electrode 310 may be connected with the source terminal or drain terminal of the driving thin film transistor 250 via the first reflective plate 315 and the first contact electrode 410 formed in a single-layered structure. That is, according as a contact hole which penetrates through the first insulating layer 510 and the second insulating layer 520 at the same time is provided, the first contact electrode 410 may be formed in a single-layered structure. If needed, it is possible to connect the first electrode 310 with the source terminal or drain terminal of the driving thin film transistor 250 via the first reflective plate 315 without the first contact electrode 410.

The electroluminescent display device according to one embodiment of the present disclosure is formed in a top emission type, whereby the first reflective plate 315 upwardly reflects light emitted from the emission layer 700. Meanwhile, the first electrode 310 may be formed of a transparent electrode or a semi-transparent electrode. In the entire specification, the transparent electrode is an electrode capable of transmitting incident light, and the semi-transparent electrode is an electrode capable of transmitting some of incident light and reflecting the remaining light.

If the first electrode 310 is formed of the transparent electrode, some of the light emitted from the emission layer 700 is reflected on the first reflective plate 315, and is then upwardly advanced through the first electrode 310.

If the first electrode 310 is formed of the semi-transparent electrode, some of the light emitted from the emission layer 700 is reflected on the first electrode 310 and is then advanced upwardly, and some other of the light emitted from the emission layer 700 is downwardly advanced through the first electrode 310, and is then reflected on the first reflective plate 315. In this case, some of the light reflected on the first reflective plate 315 is upwardly advanced through the first electrode 310, and some other of the light reflected on the first reflective plate 315 is reflected on the first electrode 310 and is downwardly advanced, and is then re-reflected on the first reflective plate 315, and the aforementioned process is repeated.

According as the reflection and re-reflection of the light between the first reflective plate 315 and the first electrode 310 is repeated, the light is amplified so that it is possible to improve a light efficiency. Especially, if a distance between the first reflective plate 315 and the first electrode 310 becomes an integer multiple of a half wavelength ($\lambda/2$) of light emitted from the first sub pixel (SP1), the light is amplified by a constructive interference, whereby an external extraction efficiency of light may be improved by the continuous increase of the amplified light through the aforementioned light reflection and re-reflection process. This property may be referred as the microcavity property. For example, the distance in the first sub pixel (SP1) for emitting red (R) light corresponding to a long wavelength may be relatively larger than that of the other sub pixel (SP1, SP2).

Also, some of the light passing through the first electrode 310 transmits through the second electrode 800 formed of the semi-transparent electrode, and some other of the light passing through the first electrode 310 is reflected on the second electrode 800, and is then advanced to the first reflective plate 315. In this case, the light reflection process and the light re-reflection process are repeated between the first reflective plate 315 and the second electrode 800 so that it is possible to realize the microcavity property.

The insulating layers 510, 520, and 530 are provided on the circuit device layer 200. The insulating layers 510, 520, and 530 protect the circuit device layer 200, and planarizes an upper surface of the substrate 100. In detail, the first insulating layer 510 is provided on the circuit device layer 200, the second insulating layer 520 is provided on the first insulating layer 510, and the third insulating layer 530 is provided on the second insulating layer 520.

The first insulating layer 510 may be provided in the entire area of each first sub pixel (SP1) except the second contact hole (CH12) area, whereby the first insulating layer 510 in the first sub pixel (SP1) of the first pixel (P1) and the first insulating layer 510 in the first sub pixel (SP1) of the second pixel (P2) may be connected with each other. The second insulating layer 520 may be provided in the entire area of each first sub pixel (SP1) except the third contact hole (CH13) area, whereby the second insulating layer 520 in the first sub pixel (SP1) of the first pixel (P1) and the second insulating layer 520 in the first sub pixel (SP1) of the second pixel (P2) may be connected with each other. The third insulating layer 530 may be provided in the entire area of each first sub pixel (SP1) except the fourth contact hole (CH14) area, whereby the third insulating layer 530 in the first sub pixel (SP1) of the first pixel (P1) and the third insulating layer 530 in the first sub pixel (SP1) of the second pixel (P2) may be connected with each other. The contact hole (CH11, CH12, CH13, CH14) is provided in the area overlapped with the first contact area (CA1).

The bank 600 is provided to cover both ends of the first electrode 310 on the insulating layer 510, 520, and 530 so that it is possible to prevent a current from being concentrated on the ends of the first electrode 310, to thereby prevent a problem related with a deterioration of a light emission efficiency. The exposed area of the first electrode 310, which is exposed without being covered by the bank 600, becomes the first emission area (EA1). The bank 600 may be formed of an inorganic insulating film, but not limited to this type. The bank 600 may be formed of an organic insulating film.

The emission layer 700 is provided on each first sub pixel (SP1) and also provided on the boundary area between each of the first sub pixels (SP1). That is, the emission layer 700 is provided on the first electrode 310 and the bank 600.

The emission layer 700 may be provided to emit white (W) colored light. To this end, the emission layer 700 may include a plurality of stacks configured to emit different colored light. In detail, the emission layer 700 may include a first stack 710, a second stack 730, and a charge generation layer (CGL) 720 provided between the first stack 710 and the second stack 730.

The emission layer 700 is provided in the area overlapped with the first contact area (CA1) in each first sub pixel (SP1). Thus, charges in the emission layer 700, particularly, charges in the charge generation layer 720 with good conductivity are transferred to the area overlapped with the first contact area (CA1), whereby a light emission may be generated in the first contact area (CA1) due to a leakage current.

However, according to one embodiment of the present disclosure, the charge blocking layer 750 is provided in the area overlapped with the first contact area (CA1) so that it is possible to prevent the light emission caused by the leakage current in the first contact area (CA1). The charge blocking layer 750 may be provided between the emission layer 700 and the second electrode 800, and more particularly, provided between the second stack 730 and the second electrode 800, whereby it is possible to prevent charges of the second electrode 800, for example, electrons from being transferred to the emission layer 700. That is, the charge blocking layer 750 blocks an electric field between the second electrode 800 and the charge generation layer 720 of the emission layer 700.

Accordingly, the charge blocking layer 750 may include a material capable of preventing a transfer of charge. Also, in order to prevent an organic material included in the emission layer 700 from being damaged when the charge blocking layer 750 is patterned, the charge blocking layer 750 may include a material capable of being patterned by a photo patterning process while preventing the damage on the organic material included in the emission layer 700. The charge blocking layer 750 having the above properties may be formed of polyvinyl alcohol, but not limited to this material.

Also, the emission layer 700 is provided in a connected structure between the first sub pixel (SP1) of the first pixel (P1) and the first sub pixel (SP1) of the second pixel (P2). The first sub pixel (SP1) of the first pixel (P1) and the first sub pixel (SP1) of the second pixel (P2) emit the same colored light. Thus, even though a leakage current is generated between the first sub pixel (SP1) of the first pixel (P1) and the first sub pixel (SP1) of the second pixel (P2), a deterioration of picture quality may be insignificant. However, if the light emission is generated on the boundary area between the first sub pixel (SP1) of the first pixel (P1) and the first sub pixel (SP1) of the second pixel (P2), the light is refracted by the various organic materials so that it may cause a problem related with the different-colored light emission between the first sub pixel (SP1) and the boundary area between the first sub pixel (SP1) of the first pixel (P1) and the first sub pixel (SP1) of the second pixel (P2).

However, according to one embodiment of the present disclosure, the charge blocking layer 750 is provided in the area overlapped with the boundary area between the first sub pixel (SP1) of the first pixel (P1) and the first sub pixel (SP1) of the second pixel (P2) so that it is possible to prevent the light emission caused by the leakage current in the boundary area.

The charge blocking layer 750 is provided in the area overlapped with the first contact area (CA1), and the area overlapped with the boundary area between the first sub pixel (SP1) of the first pixel (P1) and the first sub pixel (SP1) of the second pixel (P2). However, the charge blocking layer 750 is not overlapped with the first emission area (EA1).

The second electrode 800 is provided on the charge blocking layer 750. The second electrode 800 may function as a cathode of the electroluminescent display device. In the same manner as the emission layer 700, the second electrode 800 is provided on each first sub pixel (SP1) and also provided on the boundary area between each of the first sub pixels (SP1). Some portions of a lower surface of the second electrode 800 may be in contact with the charge blocking layer 750 and the remaining portions of the lower surface of the second electrode 800 may be in contact with the emission layer 700.

The second electrode 800 may be formed of a semi-transparent electrode, whereby it is possible to obtain a microcavity effect in the first sub pixel (SP1).

The encapsulation layer 850 is provided on the second electrode 800 so that it is possible to prevent ambient moisture from being permeated into the emission layer 700. The encapsulation layer 850 may be formed of an inorganic insulating material, or may be formed in a deposition structure obtained by alternately depositing an inorganic insulating material and an organic insulating material, but not limited to these structures.

The first color filter 910 is provided on the encapsulation layer 850. The first color filter 910 may be formed of a red color filter provided in the first sub pixel (SP1). The first color filter 910 may extend from the first sub pixel (SP1) of the first pixel (P1) to the first sub pixel (SP1) of the second pixel (P2).

Figure 3:
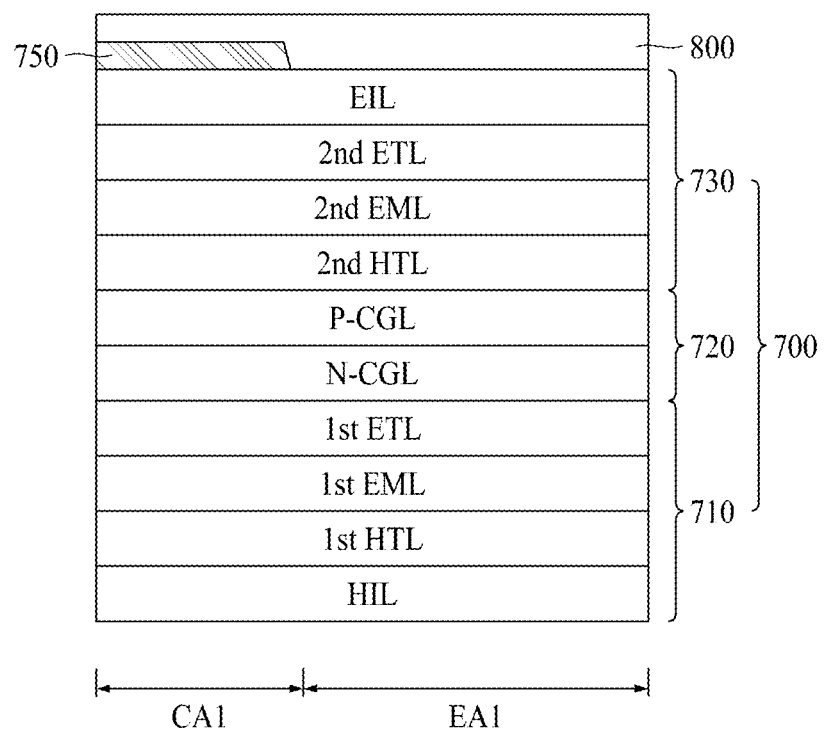
FIGS. 3 to 5 are schematic cross sectional views illustrating various electroluminescent display devices according to the embodiment of the present disclosure, which show a deposition structure of an emission layer, a charge blocking layer, and a second electrode.
Figure 4:
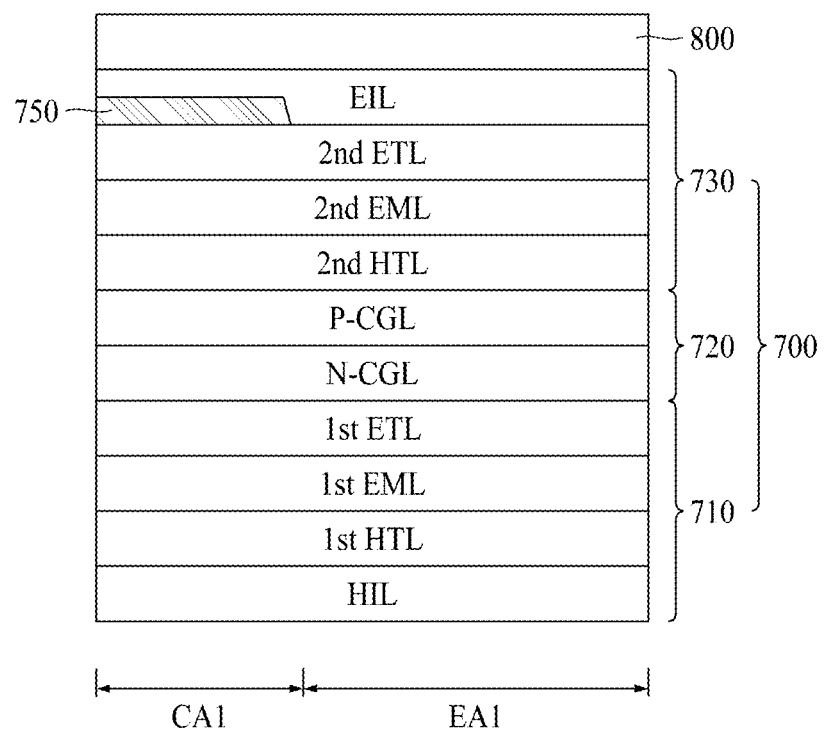
Figure 5:
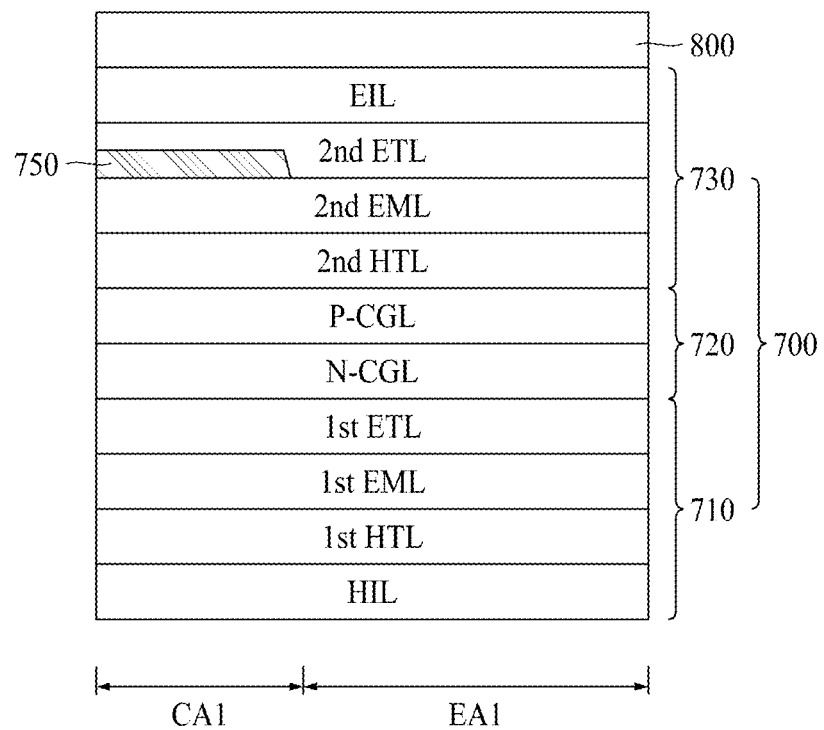

FIGS. 3 to 5 are cross sectional views illustrating electroluminescent display devices according to the various embodiments of the present disclosure, which show a deposition structure of an emission layer 700, a charge blocking layer 750, and a second electrode 800.

As shown in FIG. 3, according to one embodiment of the present disclosure, in an area overlapped with a first contact area (CA1), a charge blocking layer 750 is provided on an upper surface of an emission layer 700, and a second electrode 800 is provided on an upper surface of the charge blocking layer 750. Meanwhile, in an area overlapped with a first emission area (EA1), the second electrode 800 is provided on the upper surface of the emission layer 700. That is, the emission layer 700 extends to the first emission area (EA1) in the first contact area (CA1). However, the charge blocking layer 750 is patterned in the first contact area (CA1), and the charge blocking layer 750 does not extend to the first emission area (EA1).

The emission layer 700 includes a first stack 710, a charge generation layer 720, and a second stack 720. The first stack 710 may include a hole injection layer (HIL), a first hole transport layer ($1^{st}$ HTL), a first emission layer ($1^{st}$ EML), and a first electron transport layer ($1^{st}$ ETL), which are deposited in sequence, but not limited to this structure. The first emission layer ($1^{st}$ EML) may be formed of a blue emission layer, but not limited to this type. The charge generation layer 720 may include an N-type charge generation layer (N-CGL) on the first stack 710, and a P-type charge generation layer (P-CGL) on the N-type charge generation layer (N-CGL). The second stack 730 may include a second hole transport layer ($2^{nd}$ HTL), a second emission layer ($2^{nd}$ EML), a second electron transport layer ($2^{nd}$ ETL), and an electron injection layer (EIL), which are deposited in sequence, but not limited to this structure. The second emission layer ($2^{nd}$ EML) may be formed of a yellow-green emission layer, but not limited to this type.

The charge blocking layer 750 is provided between the emission layer 700 and the second electrode 800, and more particularly, between the second stack 730 and the second electrode 800. Especially, the charge blocking layer 750 may be provided on an upper surface of the second stack 730, and more particularly, on an upper surface of the electron injection layer (EIL). That is, the charge blocking layer 750 may be provided between the electron injection layer (EIL) and the second electrode 800.

The charge blocking layer 750 prevents an electron generated in the second electrode 800 from being transferred to the second emission layer ($2^{nd}$ EML) of the second stack 730 so that it is possible to prevent a light emission of the second emission layer ($2^{nd}$ EML) in the area overlapped with the first contact area (CA1).

Except a deposition position of the charge blocking layer 750, electroluminescent display devices of FIGS. 4 and 5 are identical in structure to that of FIG. 3. Hereinafter, only different structures will be described in detail.

As shown in FIG. 4, the charge generation layer 750 may be provided between the second electron transport layer ($2^{nd}$ ETL) of the second stack 730 and the electron injection layer (EIL) of the second stack 730.

Also, as shown in FIG. 5, the charge generation layer 750 may be provided between the second emission layer ($2^{nd}$ EML) of the second stack 730 and the second electron transport layer ($2^{nd}$ ETL) of the second stack 730.

The charge blocking layer 750 is provided between the second emission layer ($2^{nd}$ EML) and the second electrode 800 so that it is possible to prevent an electron generated in the second electrode 800 from being transferred to the second emission layer ($2^{nd}$ EML), to thereby prevent a light emission in the second emission layer ($2^{nd}$ EML). Accordingly, the charge blocking layer 750 may be positioned at various points between the second emission layer ($2^{nd}$ EML) and the second electrode 800. Also, the charge blocking layer 750 may be formed in a structure comprising a plurality of layers positioned at various points between the second emission layer ($2^{nd}$ EML) and the second electrode 800.

Figure 6:
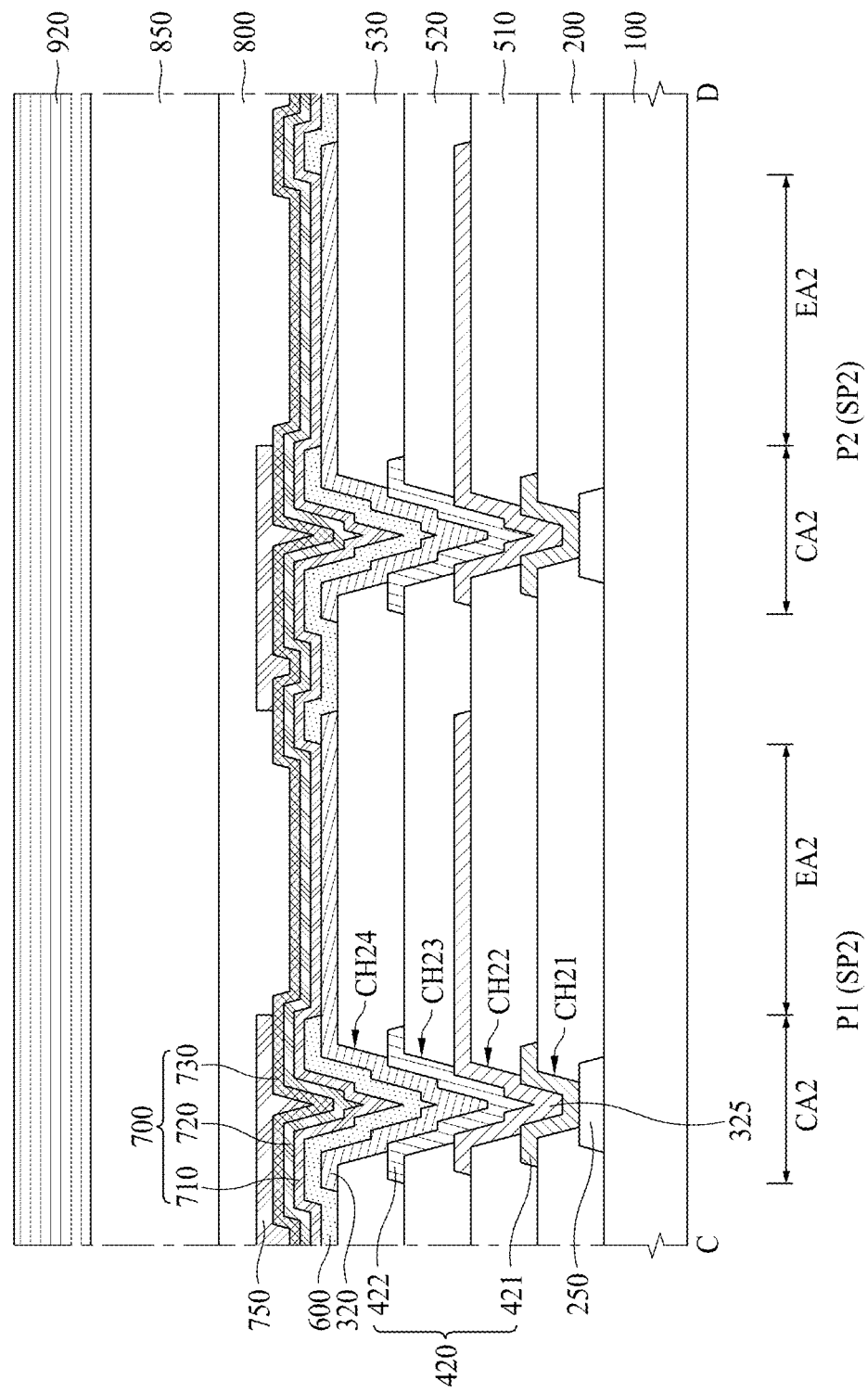
FIG. 6 is a schematic cross sectional view illustrating the electroluminescent display device according to one embodiment of the present disclosure, which is a cross sectional view along C-D line of FIG. 1.

FIG. 6 is a cross sectional view illustrating the electroluminescent display device according to one embodiment of the present disclosure, which is a cross sectional view along C-D line of FIG. 1. That is, FIG. 6 shows a cross section of the second sub pixel (SP2) of the first pixel (P1), and a cross section of the second sub pixel (SP2) of the second pixel (P2).

As shown in FIG. 6, the electroluminescent display device according to one embodiment of the present disclosure includes the substrate 100, the circuit device layer 200, the first electrode 320, a second reflective plate 325, a second contact electrode 420, the insulating layer 510, 520, and 530, the bank 600, the emission layer 700, the charge blocking layer 750, the second electrode 800, the encapsulation layer 850, and a second color filter 920. Hereinafter, a detail description for the same parts of the aforementioned embodiment will be omitted.

On the substrate 100, the second sub pixel (SP2) of the first pixel (P1) and the second sub pixel (SP2) of the second pixel (P2) are provided to be adjacent to each other. The respective second sub pixels (SP2) of the respective pixels (P1, P2) may be configured to emit the same colored light, for example, green colored light.

The circuit device layer 200 is provided on the substrate 100. In the circuit device layer 200, a circuit device including various signal lines, thin film transistors, and a capacitor is provided in the second sub pixel (SP2) of each of the pixels (P1, P2). In the circuit device layer 200, a first contact hole (CH21) is provided by each second sub pixel (SP2), whereby the source terminal or drain terminal of the driving thin film transistor 250 is exposed via the first contact hole (CH21).

On the circuit device layer 200, and more particularly, on the insulating layers 510, 520, and 530, the first electrode 320 is patterned by each second sub pixel (SP2). The first electrode 320 extends from the second contact area (CA2) to the second emission area (EA2).

The first electrode 320 is electrically connected with the source terminal or drain terminal of the driving thin film transistor 250 through the second contact electrode 420 and the second reflective plate 325. The second contact electrode 420 may include a second lower layer 421 and a second upper layer 422 provided in the second contact area (CA2).

The second lower layer 421 is provided on the circuit device layer 200, and the second lower layer 421 may be connected with the source terminal or drain terminal of the driving thin film transistor 250 via the first contact hole (CH21) provided in the circuit device layer 200. If needed, the second lower layer 421 may be connected with the source terminal or drain terminal of the driving thin film transistor 250 through a conductive material filled in the first contact hole (CH21).

The second reflective plate 325 is provided on the first insulating layer 510, and the second reflective plate 325 may be connected with the second lower layer 421 via a second contact hole (CH22) provided in the first insulating layer 510. The second reflective plate 325 extends from the second contact area (CA2) to the second emission area (EA2).

The second upper layer 422 is provided on the second insulating layer 520, and the second upper layer 422 may be connected with the second reflective plate 325 via a third contact hole (CH23) provided in the second insulating layer 520. The first electrode 320 is provided on the third insulating layer 530, and the first electrode 320 may be connected with the second upper layer 422 via a fourth contact hole (CH24) provided in the third insulating layer 530.

Accordingly, the first electrode 320 may be connected with the source terminal or drain terminal of the driving thin film transistor 250 via the second upper layer 422, the second reflective plate 325, and the second lower layer 421, but not limited to this structure. For example, the first electrode 320 may be connected with the source terminal or drain terminal of the driving thin film transistor 250 via the second reflective plate 325 and the second contact electrode 420 formed in a single-layered structure. If needed, it is possible to connect the first electrode 320 with the source terminal or drain terminal of the driving thin film transistor 250 via the second reflective plate 325 without the second contact electrode 420.

The electroluminescent display device according to one embodiment of the present disclosure is formed in a top emission type, whereby the second reflective plate 325 upwardly reflects light emitted from the emission layer 700. Also, the first electrode 320 may be formed of a transparent electrode or a semi-transparent electrode. If the first electrode 320 is formed of the transparent electrode, some of the light emitted from the emission layer 700 is reflected on the second reflective plate 325, and is then upwardly advanced through the first electrode 320.

If the first electrode 320 is formed of the semi-transparent electrode, the light emitted from the emission layer 700 is repetitively reflected and re-reflected between the second reflective plate 325 and the first electrode 320 so that it is possible to obtain a microcavity effect. In this case, a distance between the second reflective plate 325 and the first electrode 320 becomes an integer multiple of a half wavelength ($\lambda/2$) of green colored light corresponding to a middle wavelength.

Also, it is possible to obtain a microcavity effect by the repetitive reflection and re-reflection between the second reflective plate 325 and the second electrode 800. In this case, a distance between the second reflective plate 325 and the second electrode 800 becomes an integer multiple of a half wavelength ($\lambda/2$) of green colored light corresponding to a middle wavelength.

The first insulating layer 510 may be provided in the entire area of each second sub pixel (SP2) except the second contact hole (CH22), whereby the first insulating layer 510 in the second sub pixel (SP2) of the first pixel (P1) and the first insulating layer 510 in the second sub pixel (SP2) of the second pixel (P2) may be connected with each other. The second insulating layer 520 may be provided in the entire area of each second sub pixel (SP2) except the third contact hole (CH23), whereby the second insulating layer 520 in the second sub pixel (SP2) of the first pixel (P1) and the second insulating layer 520 in the second sub pixel (SP2) of the second pixel (P2) may be connected with each other. The third insulating layer 530 may be provided in the entire area of each second sub pixel (SP2) except the fourth contact hole (CH24), whereby the third insulating layer 530 in the second sub pixel (SP2) of the first pixel (P1) and the third insulating layer 530 in the second sub pixel (SP2) of the second pixel (P2) may be connected with each other.

The bank 600 is provided to cover both ends of the first electrode 320 on the insulating layers 510, 520, and 530. The exposed area of the first electrode 320, which is exposed without being covered by the bank 600, becomes the second emission area (EA2).

The emission layer 700 is provided on each second sub pixel (SP2) and also provided on the boundary area between each of the second sub pixels (SP2). That is, the emission layer 700 is provided on the first electrode 320 and the bank 600. The emission layer 700 is provided in the area overlapped with the second contact area (CA2) on each second sub pixel (SP2), and the emission layer 700 is formed in a connected structure between the second sub pixel (SP2) of the first pixel (P1) and the second sub pixel (SP2) of the second pixel (P2).

The charge blocking layer 750 is provided in the area overlapped with the second contact area (CA2), and the area overlapped with the boundary area between the second sub pixel (SP2) of the first pixel (P1) and the second sub pixel (SP2) of the second pixel (P2). The charge blocking layer 750 is not overlapped with the second emission area (EA2).

The charge blocking layer 750 is provided in the area between the second electrode 800 and the second emission layer of the second stack 730, as shown in FIGS. 3 to 5.

The second electrode 800 is provided on the charge blocking layer 750, and the encapsulation layer 850 is provided on the second electrode 800.

The second color filter 920 is provided on the encapsulation layer 850. The second color filter 920 may be formed of a green color filter provided in the second sub pixel (SP2). The second color filter 920 may extend from the second sub pixel (SP2) of the first pixel (P1) to the second sub pixel (SP2) of the second pixel (P2).

Figure 7:
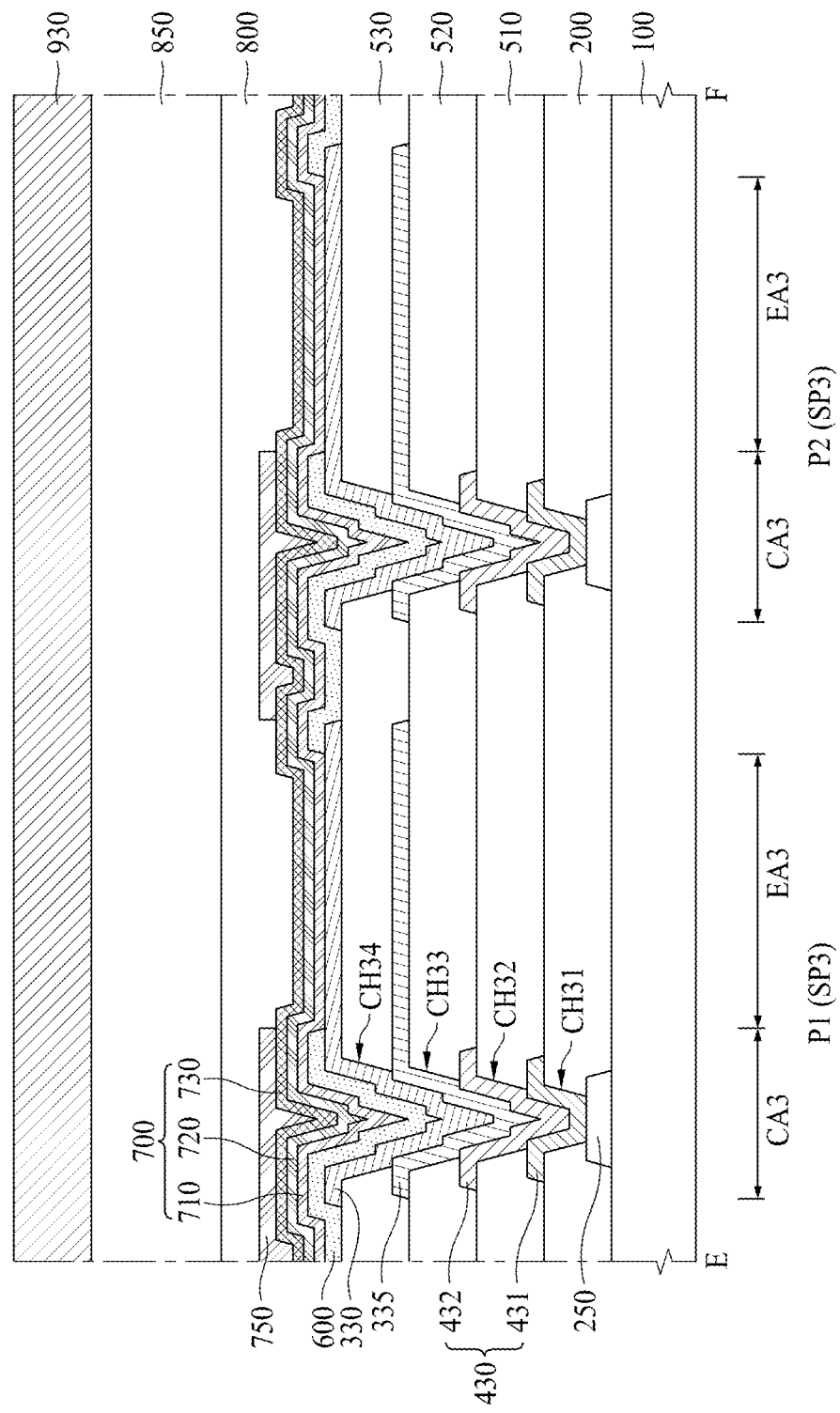
FIG. 7 is a schematic cross sectional view illustrating the electroluminescent display device according to one embodiment of the present disclosure, which is a cross sectional view along E-F line of FIG. 1.

FIG. 7 is a cross sectional view illustrating the electroluminescent display device according to one embodiment of the present disclosure, which is a cross sectional view along E-F line of FIG. 1. That is, FIG. 7 shows a cross section of the third sub pixel (SP3) of the first pixel (P1), and a cross section of the third sub pixel (SP3) of the second pixel (P2).

As shown in FIG. 7, the electroluminescent display device according to one embodiment of the present disclosure includes the substrate 100, the circuit device layer 200, the first electrode 330, a third reflective plate 335, a third contact electrode 430, the insulating layers 510, 520, and 530, the bank 600, the emission layer 700, the charge blocking layer 750, the second electrode 800, the encapsulation layer 850, and a third color filter 930. Hereinafter, a detail description for the same parts of the aforementioned embodiment will be omitted.

On the substrate 100, the third sub pixel (SP3) of the first pixel (P1) and the third sub pixel (SP3) of the second pixel (P2) are provided to be adjacent to each other. The respective third sub pixels (SP3) of the respective pixels (P1, P2) may be configured to emit the same colored light, for example, blue colored light.

The circuit device layer 200 is provided on the substrate 100. In the circuit device layer 200, a circuit device including various signal lines, thin film transistors, and a capacitor is provided in the third sub pixel (SP3) of each of the pixels (P1, P2). In the circuit device layer 200, a first contact hole (CH31) is provided by each third sub pixel (SP3), whereby the source terminal or drain terminal of the driving thin film transistor 250 is exposed via the first contact hole (CH31).

On the circuit device layer 200, and more particularly, on the insulating layers 510, 520, and 530, the first electrode 330 is patterned by each third sub pixel (SP3). The first electrode 330 extends from the third contact area (CA3) to the third emission area (EA3).

The first electrode 330 is electrically connected with the source terminal or drain terminal of the driving thin film transistor 250 through the third contact electrode 430 and the third reflective plate 335. The third contact electrode 430 may include a third lower layer 431 and a third upper layer 432 provided in the third contact area (CA3).

The third lower layer 431 is provided on the circuit device layer 200, and the third lower layer 431 may be connected with the source terminal or drain terminal of the driving thin film transistor 250 via the first contact hole (CH31) provided in the circuit device layer 200. If needed, the third lower layer 431 may be connected with the source terminal or drain terminal of the driving thin film transistor 250 through a conductive material filled in the first contact hole (CH31). The third upper layer 432 is provided on the first insulating layer 510, and the third upper layer 432 may be connected with the third lower layer 431 via a second contact hole (CH32) provided in the first insulating layer 510. The third reflective plate 335 is provided on the second insulating layer 520, and the third reflective plate 335 may be connected with the third upper layer 432 via a third contact hole (CH33) provided in the second insulating layer 520. The first electrode 330 is provided on the third insulating layer 530, and the first electrode 330 may be connected with the third reflective plate 335 via a fourth contact hole (CH34) provided in the third insulating layer 530.

Accordingly, the first electrode 330 may be connected with the source terminal or drain terminal of the driving thin film transistor 250 via the third reflective plate 335, the third upper layer 432, and the third lower layer 431, but not limited to this structure. For example, the first electrode 330 may be connected with the source terminal or drain terminal of the driving thin film transistor 250 via the third reflective plate 335 and the third contact electrode 430 formed in a single-layered structure. If needed, it is possible to connect the first electrode 330 with the source terminal or drain terminal of the driving thin film transistor 250 via the third reflective plate 335 without the third contact electrode 430.

The electroluminescent display device according to one embodiment of the present disclosure is formed in a top emission type, whereby the third reflective plate 335 upwardly reflects light emitted from the emission layer 700. Also, the first electrode 330 may be formed of a transparent electrode or a semi-transparent electrode. If the first electrode 330 is formed of the transparent electrode, some of the light emitted from the emission layer 700 is reflected on the third reflective plate 335, and is then upwardly advanced through the first electrode 330.

If the first electrode 330 is formed of the semi-transparent electrode, the light emitted from the emission layer 700 is repetitively reflected and re-reflected between the third reflective plate 335 and the first electrode 330 so that it is possible to obtain a microcavity effect. In this case, a distance between the third reflective plate 335 and the first electrode 330 becomes an integer multiple of a half wavelength ($\lambda/2$) of blue colored light corresponding to a short wavelength.

Also, it is possible to obtain a microcavity effect by the repetitive reflection and re-reflection between the third reflective plate 335 and the second electrode 800. In this case, a distance between the third reflective plate 335 and the second electrode 800 becomes an integer multiple of a half wavelength ($\lambda/2$) of blue colored light corresponding to a short wavelength.

The first insulating layer 510 may be provided in the entire area of each third sub pixel (SP3) except the second contact hole (CH32), whereby the first insulating layer 510 in the third sub pixel (SP3) of the first pixel (P1) and the first insulating layer 510 in the third sub pixel (SP3) of the second pixel (P2) may be connected with each other. The second insulating layer 520 may be provided in the entire area of each third sub pixel (SP3) except the third contact hole (CH33), whereby the second insulating layer 520 in the third sub pixel (SP3) of the first pixel (P1) and the second insulating layer 520 in the third sub pixel (SP3) of the second pixel (P2) may be connected with each other. The third insulating layer 530 may be provided in the entire area of each third sub pixel (SP3) except the fourth contact hole (CH34), whereby the third insulating layer 530 in the third sub pixel (SP3) of the first pixel (P1) and the third insulating layer 530 in the third sub pixel (SP3) of the second pixel (P2) may be connected with each other.

The bank 600 is provided to cover both ends of the first electrode 330 on the insulating layers 510, 520, and 530. The exposed area of the first electrode 330, which is exposed without being covered by the bank 600, becomes the third emission area (EA3).

The emission layer 700 is provided on each third sub pixel (SP3) and also provided on the boundary area between each of the third sub pixels (SP3). That is, the emission layer 700 is provided on the first electrode 330 and the bank 600. The emission layer 700 is provided in the area overlapped with the third contact area (CA3) on each third sub pixel (SP3), and the emission layer 700 is formed in a connected structure between the third sub pixel (SP3) of the first pixel (P1) and the third sub pixel (SP3) of the second pixel (P2).

The charge blocking layer 750 is provided in the area overlapped with the third contact area (CA3), and the area overlapped with the boundary area between the third sub pixel (SP3) of the first pixel (P1) and the third sub pixel (SP3) of the second pixel (P2). The charge blocking layer 750 is not overlapped with the third emission area (EA3).

The charge blocking layer 750 is provided in the area between the second electrode 800 and the second emission layer of the second stack 730, as shown in FIGS. 3 to 5.

The second electrode 800 is provided on the charge blocking layer 750, and the encapsulation layer 850 is provided on the second electrode 800.

The third color filter 930 is provided on the encapsulation layer 850. The third color filter 930 may be formed of a blue color filter provided in the third sub pixel (SP3). The third color filter 930 may extend from the third sub pixel (SP3) of the first pixel (P1) to the third sub pixel (SP3) of the second pixel (P2).

Figure 8:
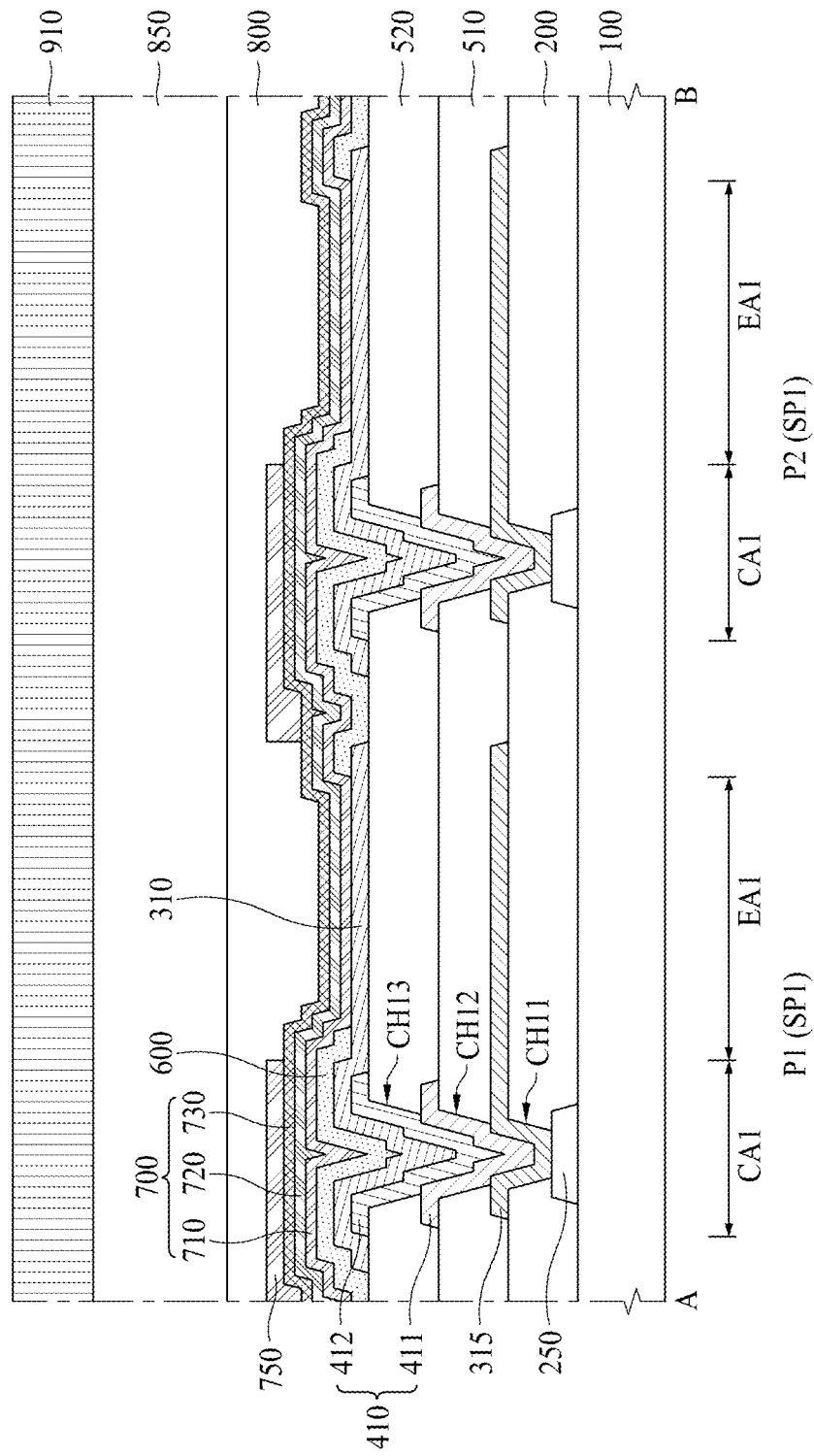
FIG. 8 is a schematic cross sectional view illustrating an electroluminescent display device according to another embodiment of the present disclosure, which is a cross sectional view along A-B line of FIG. 1.

FIG. 8 is a schematic cross sectional view illustrating an electroluminescent display device according to another embodiment of the present disclosure, which is a cross sectional view along A-B line of FIG. 1. A third insulating layer 530 is not provided in the electroluminescent display device of FIG. 8, whereby the electroluminescent display device of FIG. 8 is different from the electroluminescent display device of FIG. 2. Accordingly, the same elements are denoted by the same reference numerals, and only the different structures will be described in detail as follows.

As shown in FIG. 8, according to another embodiment of the present disclosure, a first electrode 310 is directly provided on an upper surface of a first upper layer 412 of a first contact electrode 410 without an additional insulating layer in each first sub pixel (SP1). Thus, the first electrode 310 extends from a first contact area (CA1) to a first emission area (EA1) on a second insulating layer 520.

In the first emission area (EA1), a first insulating layer 510 and the second insulating layer 520 are provided between a first reflective plate 315 and the first electrode 310.

Figure 9:
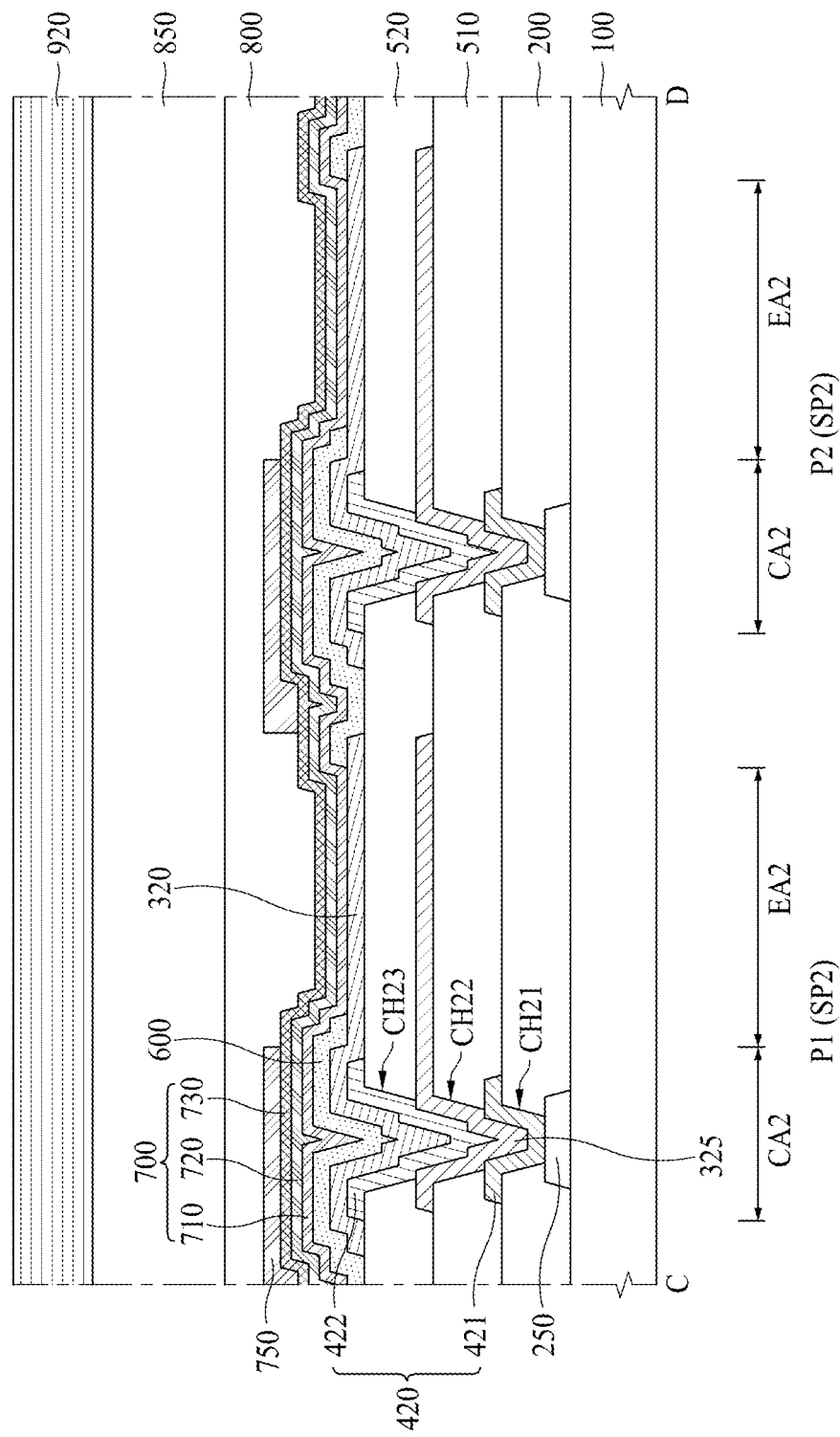
FIG. 9 is a schematic cross sectional view illustrating an electroluminescent display device according to another embodiment of the present disclosure, which is a cross sectional view along C-D line of FIG. 1.

FIG. 9 is a schematic cross sectional view illustrating the electroluminescent display device according to another embodiment of the present disclosure, which is a cross sectional view along C-D line of FIG. 1. A third insulating layer 530 is not provided in the electroluminescent display device of FIG. 9, whereby the electroluminescent display device of FIG. 9 is different from the electroluminescent display device of FIG. 6. Accordingly, the same elements are denoted by the same reference numerals, and only the different structures will be described in detail as follows.

As shown in FIG. 9, according to another embodiment of the present disclosure, a first electrode 320 is directly provided on an upper surface of a second upper layer 422 of a second contact electrode 420 without an additional insulating layer in each second sub pixel (SP2). Thus, the first electrode 320 extends from a second contact area (CA2) to a second emission area (EA2) on a second insulating layer 520.

In the second emission area (EA2), the second insulating layer 520 is provided between a second reflective plate 325 and the first electrode 320.

Figure 10:
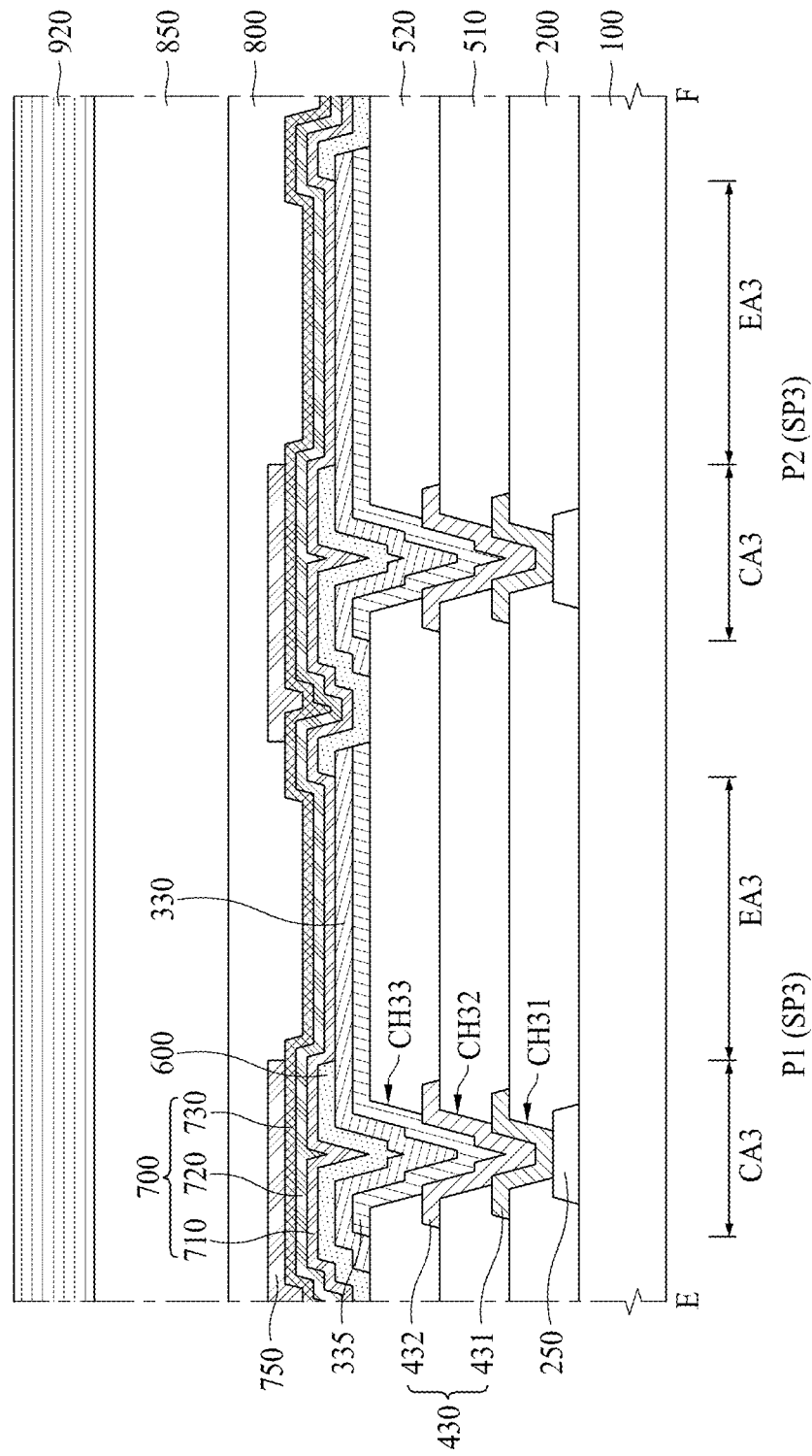
FIG. 10 is a schematic cross sectional view illustrating an electroluminescent display device according to another embodiment of the present disclosure, which is a cross sectional view along E-F line of FIG. 1.

FIG. 10 is a schematic cross sectional view illustrating the electroluminescent display device according to another embodiment of the present disclosure, which is a cross sectional view along E-F line of FIG. 1. A third insulating layer 530 is not provided in the electroluminescent display device of FIG. 10, whereby the electroluminescent display device of FIG. 10 is different from the electroluminescent display device of FIG. 7. Accordingly, the same elements are denoted by the same reference numerals, and only the different structures will be described in detail as follows.

As shown in FIG. 10, according to another embodiment of the present disclosure, a first electrode 330 is directly provided on an upper surface of a third reflective plate 335 without an additional insulating layer in each third sub pixel (SP3). Thus, the first electrode 330 extends from a third contact area (CA3) to a third emission area (EA3) on a second insulating layer 520.

In the third emission area (EA3), an additional insulating layer is not provided between the third reflective plate 335 and the first electrode 330, and the third reflective plate 335 and the first electrode 330 are in contact with each other. That is, the third reflective plate 335 is provided on an upper surface of the second insulating layer 520, and the first electrode 330 is provided on an upper surface of the third reflective plate 335.

Figure 11:
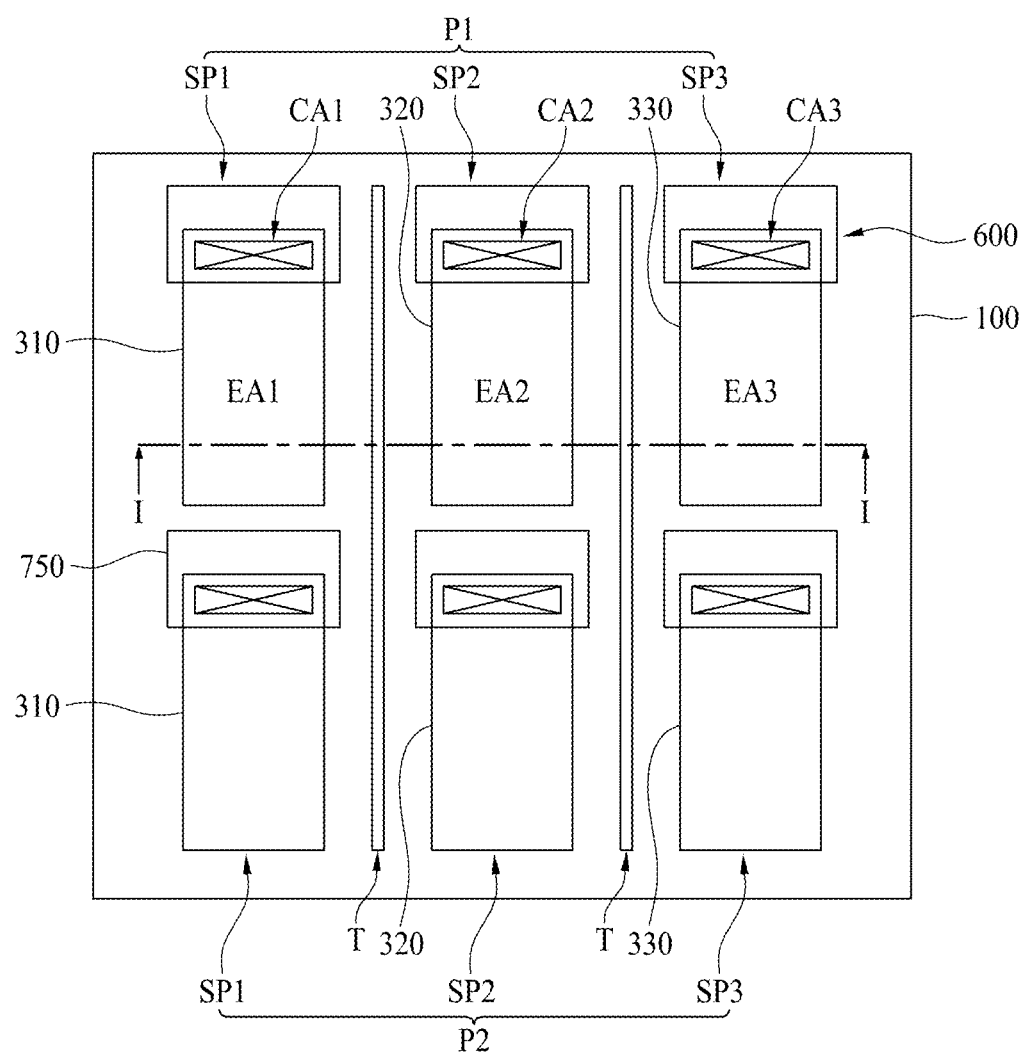
FIG. 11 is a plan view illustrating the electroluminescent display device according to another embodiment of the present disclosure.

FIG. 11 is a plan view illustrating the electroluminescent display device according to another embodiment of the present disclosure. According as a trench (T) is additionally provided in the electroluminescent display device of FIG. 11, the electroluminescent display device of FIG. 11 is different from the electroluminescent display device of FIG. 1. Hereinafter, only the different structures will be described in detail as follows.

As shown in FIG. 11, the trench (T) is provided on the boundary area between each of the plurality of sub pixels (SP1, SP2, SP3). In detail, the trench (T) is provided on the boundary area between the first sub pixel (SP1) and the second sub pixel (SP2) and between the second sub pixel (SP2) and the third sub pixel (SP3) in each of the plurality of pixels (P1, P2). The trench (T) may be continuously provided in the plurality of pixels (P1, P2) so that it is possible to realize a stripe structure.

According to another embodiment of the present disclosure, the trench (T) is provided, and thus, a portion of an emission layer provided in the trench (T) may be disconnected, whereby it is possible to prevent a leakage current between the neighboring sub pixels (SP1, SP2, SP3). This will be described with reference to the following cross sectional structures to be explained later.

Figure 12:
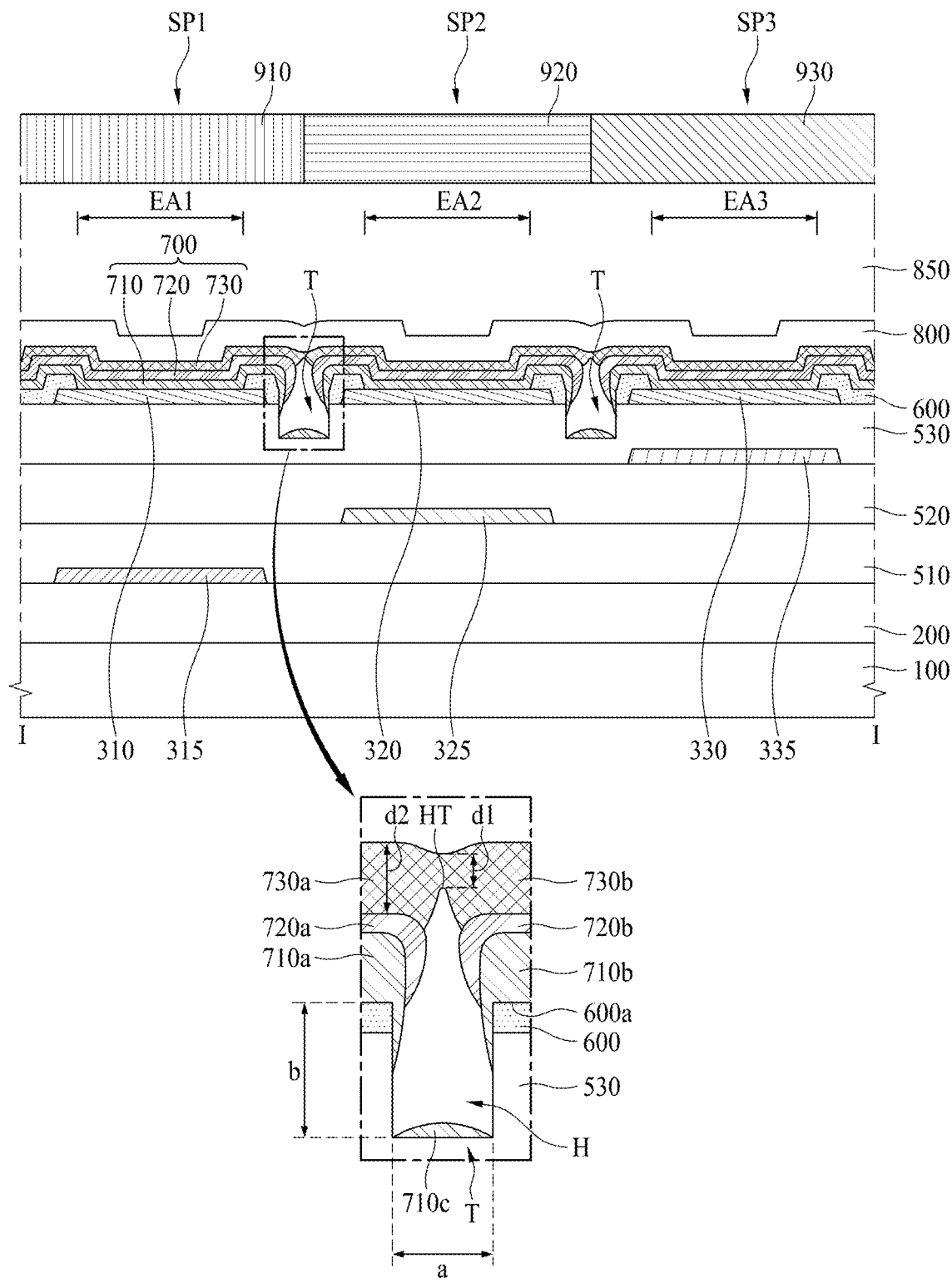
FIG. 12 is a cross sectional view illustrating the electroluminescent display device according to another embodiment of the present disclosure, which is a cross sectional view along I-I line of FIG. 11.

FIG. 12 is a cross sectional view illustrating the electroluminescent display device according to another embodiment of the present disclosure, which is a cross sectional view along I-I of FIG. 11. Hereinafter, a detailed description for the same parts as those of the aforementioned embodiment will be omitted.

As shown in FIG. 12, a circuit device layer 200 is provided on a substrate 100, and a first reflective plate 315 is provided in a first sub pixel (SP1) on the circuit device layer 200.

A first insulating layer 510 is provided on the first reflective plate 315, and a second reflective plate 325 is provided in a second sub pixel (SP2) on the first insulating layer 510.

A second insulating layer 520 is provided on the second reflective plate 325, and a third reflective plate 335 is provided in a third sub pixel (SP3) on the second insulating layer 520.

A third insulating layer 530 is provided on the third reflective plate 335, and a first electrode 310, 320, and 330 is patterned for each sub pixel (SP1, SP2, SP3) on the third insulating layer 530.

In the first sub pixel (SP1), the first insulating layer 510, the second insulating layer 520, and the third insulating layer 530 are provided between the first reflective plate 315 and the first electrode 310. In the second sub pixel (SP2), the second insulating layer 520 and the third insulating layer 530 are provided between the second reflective plate 325 and the first electrode 320. In the third sub pixel (SP3), the third insulating layer 530 is provided between the third reflective plate 335 and the first electrode 330. However, as shown in FIGS. 8 to 10, it is possible to omit the third insulating layer 530.

Thus, according to another embodiment of the present disclosure, a first distance between the first reflective plate 315 and the first electrode 310 in the first sub pixel (SP1), a second distance between the second reflective plate 325 and the first electrode 320 in the second sub pixel (SP2), and a third distance between the third reflective plate 335 and the first electrode 330 in the third sub pixel (SP3) are different from each other so that it is possible to realize the microcavity properties in each sub pixel (SP1, SP2, SP3).

For example, the first distance in the first sub pixel (SP1) configured to emit red colored light corresponding to a long wavelength is set to be the longest, and the third distance in the third sub pixel (SP3) configured to emit blue colored light corresponding to a short wavelength is set to be the shortest.

A bank 600 is provided to cover both ends of the first electrode 310, 320, and 330 while being provided on the first electrode 310, 320, and 330, and an emission layer 700 is provided on the first electrode 310, 320, and 330, and the bank 600.

In this case, the trench (T) having a groove structure is provided on the bank 600 and the third insulating layer 530.

The trench (T) penetrates through the bank 500 in the boundary area between the sub pixels (SP1, SP2, SP3), and the trench (T) may extend to the inside of the third insulating layer 530. Thus, the trench (T) may be formed by a process of removing the bank 600 and a predetermined area of the third insulating layer 530. Also, although not shown, the trench (T) may penetrate through the bank 600 and the third insulating layer 530 and extend to the inside of the second insulating layer 520 below the third insulating layer 530. Or, the trench (T) may penetrate through the bank 600, the third insulating layer 530 and the second insulating layer 520 and extend to the inside of the first insulating layer 510 below the second insulating layer 520. Or, the trench (T) may penetrate through the bank 600, the third insulating layer 530, the second insulating layer 520, and the first insulating layer 510 and extend to the inside of the circuit device layer 200 below the first insulating layer 510. Also, if the bank 600 is formed of an organic material layer with a large thickness, the trench (T) may be formed by removing a predetermined area of the bank 600 without passing through the bank 600.

The trench (T) is provided to disconnect at least a portion of the emission layer 700. That is, at least a portion of the emission layer 700 is disconnectedly provided inside the trench (T), whereby it is possible to prevent a charge transfer between the neighboring sub pixels (SP1, SP2, SP3) through the emission layer 700, to thereby prevent a leakage current between the neighboring sub pixels (SP1, SP2, SP3). In order to make at least a portion of the emission layer 700 disconnectedly provided inside the trench (T), a depth (b) of the trench (T) is larger than a width (a) of the trench (T), preferably.

The emission layer 700 is formed in each area of the plurality of sub pixels (SP1, SP2, P3) and also formed in the boundary area between the plurality of sub pixels (SP1, SP2, SP3). That is, the emission layer 700 is formed on the first electrode 310, 320 and 330 and the bank 600, and also formed on the third insulating layer 530 inside the trench (T). The emission layer 700 is formed inside the trench (T), and also formed over the trench (T). According to another embodiment of the present disclosure, when the emission layer 700 is formed inside the trench (T), at least a portion of the emission layer 700 is disconnectedly provided so that it is possible to prevent a leakage current between the neighboring sub pixels (SP1, SP2, SP3).

A first stack 710 included in the emission layer 700 is formed on lateral surfaces inside the trench (T), and may be formed on a lower surface inside the trench (T).

In this case, with respect to a central portion of the trench (T), a first portion 710a of the first stack 710 formed at one lateral surface inside the trench (T), for example, a left lateral surface inside the trench (T) is disconnected from a second portion 710b of the first stack 710 formed at the other lateral surface inside the trench (T), for example, a right lateral surface inside the trench (T). Also, a third portion 710c of the first stack 710 formed on the lower surface inside the trench (T) is disconnected while being separated from the first portion 710a and the second portion 710b of the first stack 710 formed on the lateral surfaces inside the trench (T). Accordingly, a charge is not transferred through the first stack 710 between the neighboring sub pixels (SP1, SP2, SP3) which are disposed while being adjacent to each other with the trench (T) therebetween.

Also, a charge generation layer 720 included in the emission layer 700 is formed on the first stack 710. In this case, the charge generation layer 720 may be formed over the trench (T) without being extended to the inside of the trench (T). That is, the charge generation layer 720 may be formed above an upper surface 600a of one end of the bank 600 perforated by the trench (T), in other words, above the upper surface 600 of one end of the bank 600 being in contact with the trench (T), but not limited to this structure. The charge generation layer 720 may extend to the inside of the trench (T).

In this case, with respect to the central portion of the trench (T), a first portion 720a of the charge generation layer 720 formed at one side of the trench (T), for example, a left side of the trench (T) is disconnected from a second portion 720b of the charge generation layer 720 formed at the other side of the trench (T), for example, a right side of the trench (T). The first portion 720a of the charge generation layer 720 is formed on the first portion 710a of the first stack 710, and the second portion 720b of the charge generation layer 720 is formed on the second portion 710b of the first stack 710.

Accordingly, charges are not transferred between the sub pixels (SP1, SP2, SP3) adjacently disposed with the trench (T) interposed in-between through the charge generation layer 720.

A second stack 730 included in the emission layer 700 may be connectedly provided on the charge generation layer 720 between the sub pixels (SP1, SP2, SP3) which are disposed while being adjacent to each other with the trench (T) interposed in-between. That is, with respect to the central portion of the trench (T), a first portion 730a of the second stack 730 formed at one side of the trench (T), for example, a left side of the trench (T) is connected with a second portion 730b of the second stack 730 formed at the other side of the trench (T), for example, a right side of the trench (T). Accordingly, charges may be transferred between the sub pixels (SP1, SP2, SP3) adjacently disposed with the trench (T) interposed in-between through the second stack 730.

In this case, a first thickness (d1) of the second stack 730, which corresponds to some area of the trench (T) in which the charge generation layer 720 is disconnectedly provided, may be relatively smaller than a second thickness (d2) of the second stack 730 which corresponds to an area which are not overlapped with the trench (T). In other words, the first thickness (d1) of the second stack 730, which is overlapped with the area between the first portion 720a of the charge generation layer 720 and the second portion 720b of the charge generation layer 720, may be relatively smaller than the second thickness (d2) of the first portion 730a or the second portion 730b of the second stack 730.

The second stack 730 is firstly deposited on the first portion 720a of the charge generation layer 720 and the second portion 720b of the charge generation layer 720, and then the second stack 730 provided on the first portion 720a of the charge generation layer 720 meets with the second stack 730 provided on the second portion 720b of the charge generation layer 720 at the area of the trench (T). This is the reason why the first thickness (d) of the second stack 730 is relatively small. Thus, a lower portion of the second stack 730 provided with the first thickness (d1) corresponding to the relatively small thickness, for example $2^{nd}$ HTL, may be disconnectedly provided over the trench (T). That is, a lower portion of the first portion 730a of the second stack 730, for example $2^{nd}$ HTL, may be disconnected from a lower portion of the second portion 730b of the second stack 730, for example $2^{nd}$ HTL.

As described above, a pore (H) is formed inside the trench (T) by the above structure of the first stack 710, the charge generation layer 720, and the second stack 730. The pore (H) is defined by the third insulating layer 530 and the emission layer 700, whereby the pore (H) is prepared below the emission layer 700. That is, the pore (H) provided below the emission layer 700 is defined by the third insulating layer 530, the first stack 710, the charge generation layer 720, and the second stack 720. The pore (H) extends from the inside of the trench (T) to the upper portion of the trench (T), and an end (HT) of the pore (H) is positioned while being higher than at least a portion of the emission layer 700 which is disconnectedly provided inside the trench (T). In detail, the end (HT) of the pore (H) is disposed while being higher than the charge generation layer 720, whereby the first portion 720a of the charge generation layer 720 and the second portion 720b of the charge generation layer 720 are disconnected from each other by the pore (H).

Conductivity of the charge generation layer 720 is higher than that of each of the first stack 710 and the second stack 730. Especially, an N-type charge generation layer of the charge generation layer 720 may comprise a metal material, whereby conductivity of the charge generation layer 720 is higher than that of each of the first stack 710 and the second stack 730. Thus, the charge transfer between the sub pixels (SP1, SP2, SP3) which are adjacent to each other is generally made through the charge generation layer 720, and charge transfer through the second stack 730 is insignificant.

Thus, according to another embodiment of the present disclosure, the charge generation layer 720 is disconnectedly provided inside the trench (T) so that it is possible to reduce the charge transfer between the sub pixels (SP1, SP2, SP3) which are disposed while being adjacent to each other, to thereby prevent a leakage current.

A second electrode 800 is provided on the emission layer 700, an encapsulation layer 850 is provided on the second electrode 800, and a color filter 910, 920, and 930 is provided on the encapsulation layer 850. The color filter 910, 920, and 930 may include a first color filter 910 provided in the first sub pixel (SP1), a second color filter 920 provided in the second sub pixel (SP2), and a third color filter 930 provided in the third sub pixel (SP3).

Figure 13:
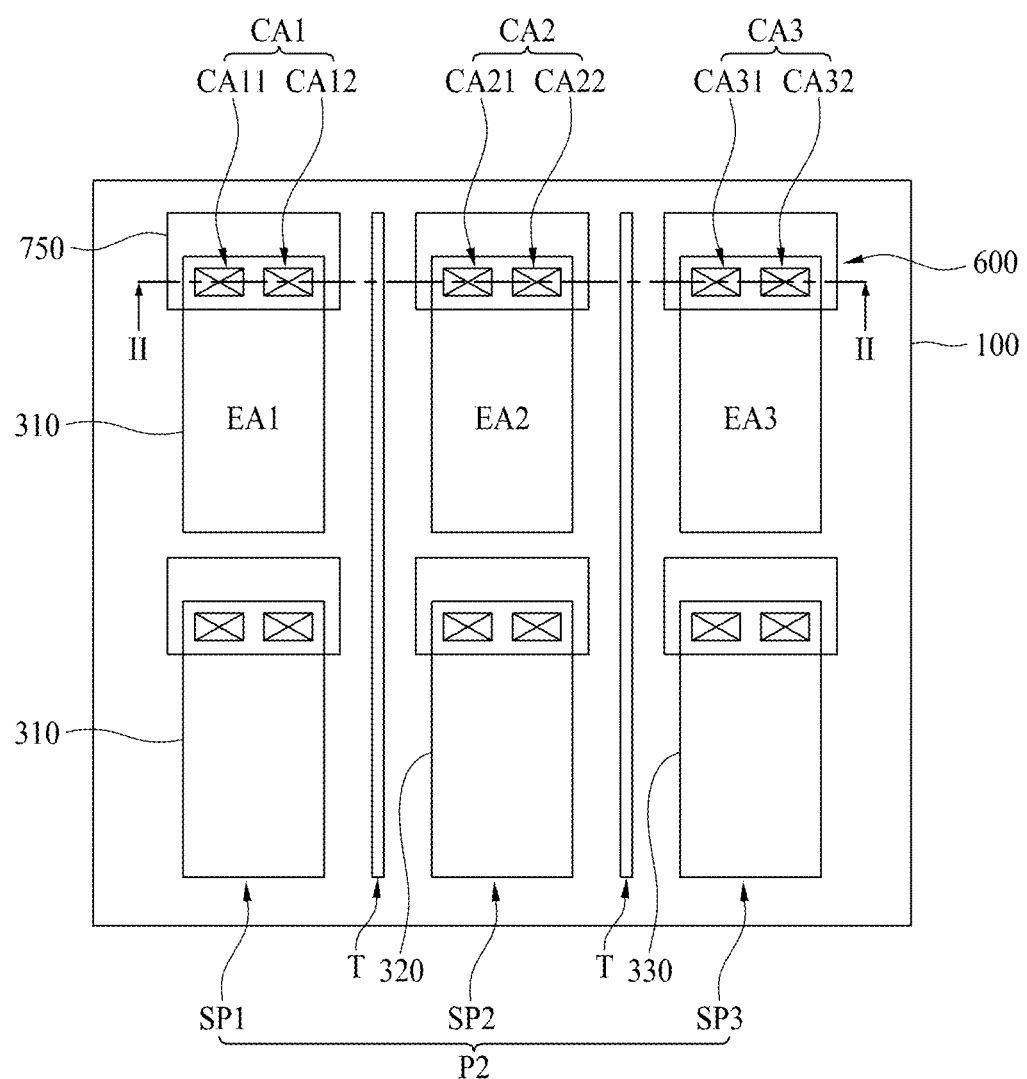
FIG. 13 is a schematic plan view illustrating an electroluminescent display device according to another embodiment of the present disclosure.

FIG. 13 is a schematic plan view illustrating an electroluminescent display device according to another embodiment of the present disclosure. The electroluminescent display device of FIG. 13 is different in structure of a contact area (CA1, CA2, CA3) from the electroluminescent display device of FIG. 11. Hereinafter, only the different structures will be described in detail as follows.

As shown in FIG. 13, according to another embodiment of the present disclosure, a first contact area (CA1) includes a first area (CA11) and a second area (CA12) which are spaced apart from each other. At least one contact hole is provided in the first area (CA11), and at least one contact hole is provided in the second area (CA12). In this case, one charge blocking layer 750 may be provided in the area overlapped with the boundary area between the first area (CA11) and the second area (CA12).

Also, a second contact area (CA2) includes a first area (CA21) and a second area (CA22) which are spaced apart from each other. At least one contact hole is provided in the first area (CA21), and at least one contact hole is provided in the second area (CA22). In this case, another charge blocking layer 750 may be provided in the area overlapped with the boundary area between the first area (CA21) and the second area (CA22).

Also, a third contact area (CA3) includes a first area (CA31) and a second area (CA32) which are spaced apart from each other. At least one contact hole is provided in the first area (CA31), and at least one contact hole is provided in the second area (CA32). In this case, another charge blocking layer 750 may be provided in the area overlapped with the boundary area between the first area (CA31) and the second area (CA32).

Figure 14:
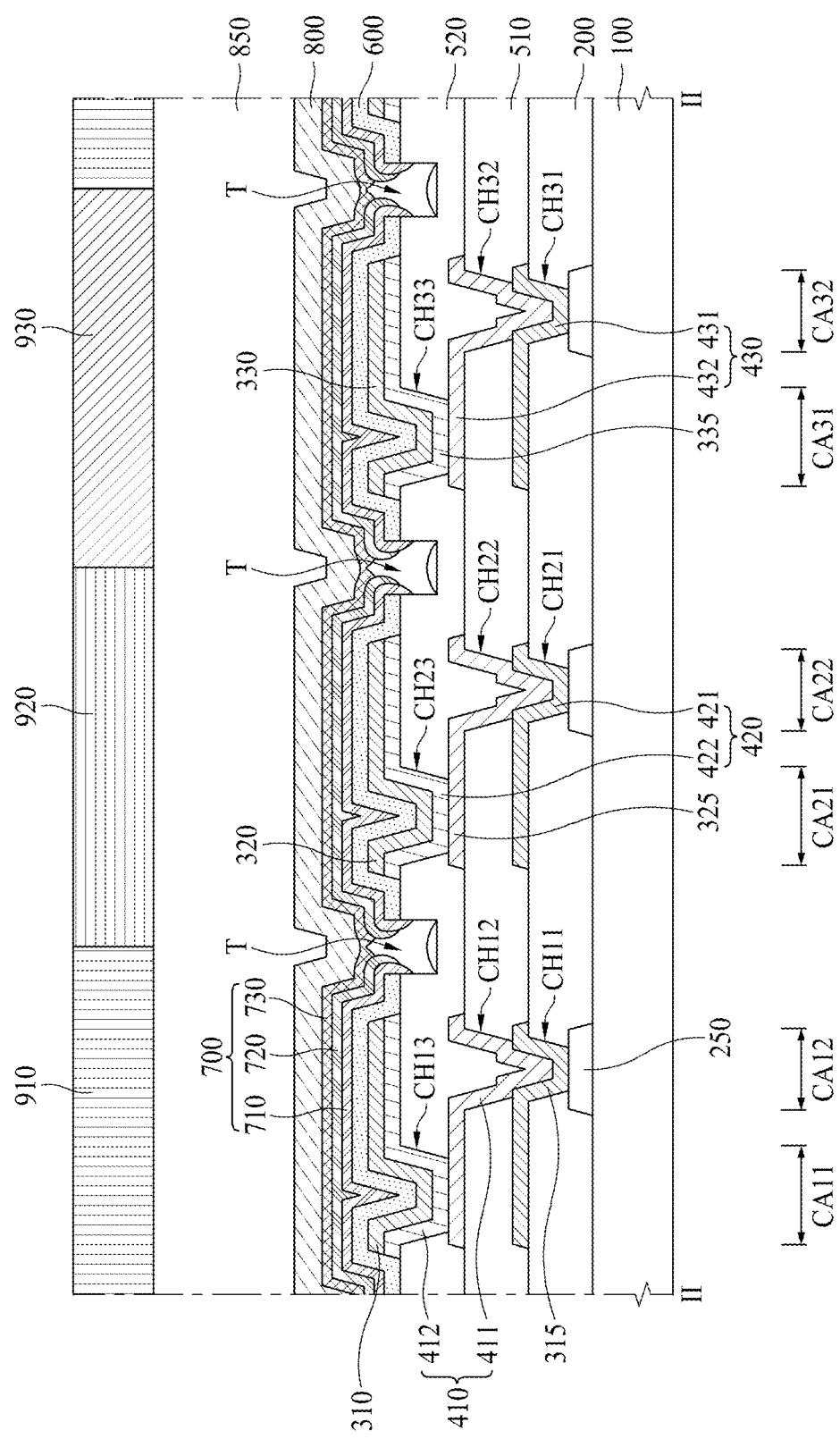
FIG. 14 is a schematic cross sectional view illustrating the electroluminescent display device according to another embodiment of the present disclosure, which is a cross sectional view along II-II line of FIG. 13.

FIG. 14 is a schematic cross sectional view illustrating the electroluminescent display device according to another embodiment of the present disclosure, which is a cross sectional view along II-II line of FIG. 13.

In the aforementioned embodiment shown in FIGS. 8 to 10, the first contact hole (CH11), the second contact hole (CH12), and the third contact hole (CH13) provided in the first sub pixel (SP1) are overlapped with each other, the first contact hole (CH21), the second contact hole (CH22), and the third contact hole (CH23) provided in the second sub pixel (SP2) are overlapped with each other, and the first contact hole (CH31), the second contact hole (CH32), and the third contact hole (CH33) provided in the third sub pixel (SP3) are overlapped with each other.

Meanwhile, according to the embodiment shown in FIG. 14, in the first sub pixel (SP1), the first contact hole (CH11) and the second contact hole (CH12) are provided in the second area (CA12) of the first contact area (CA11, CA12) while being overlapped with each other, and the third contact hole (CH13) is provided in the first area (CA11) of the first contact area (CA11, CA12) while being not overlapped with the first contact hole (CH11) and the second contact hole (CH12).

Also, in the second sub pixel (SP2), the first contact hole (CH21) and the second contact hole (CH22) are provided in the second area (CA22) of the second contact area (CA21, CA22) while being overlapped with each other, and the third contact hole (CH23) is provided in the first area (CA21) of the second contact area (CA21, CA22) while being not overlapped with the first contact hole (CH21) and the second contact hole (CH22).

Also, in the third sub pixel (SP3), the first contact hole (CH31) and the second contact hole (CH32) are provided in the second area (CA32) of the third contact area (CA31, CA32) while being overlapped with each other, and the third contact hole (CH33) is provided in the first area (CA31) of the third contact area (CA31, CA32) while being not overlapped with the first contact hole (CH31) and the second contact hole (CH32).

Although not shown, in the first sub pixel (SP1), the first contact hole (CH11) may be overlapped with the third contact hole (CH13), and may not be overlapped with the second contact hole (CH12). In the second sub pixel (SP2), the first contact hole (CH21) may be overlapped with the third contact hole (CH23), and may not be overlapped with the second contact hole (CH22). In the third sub pixel (SP3), the first contact hole (CH31) may be overlapped with the third contact hole (CH33), and may not be overlapped with the second contact hole (CH32).

Also, in the first sub pixel (SP1), the first contact hole (CH11), the second contact hole (CH12), and the third contact hole (CH13) may be not overlapped with each other. In this second sub pixel (SP2), the first contact hole (CH11), the second contact hole (CH12), and the third contact hole (CH13) may be not overlapped with each other. In the third sub pixel (SP3), the first contact hole (CH11), the second contact hole (CH12), and the third contact hole (CH13) may be not overlapped with each other.

In comparison to a case in which the first contact hole (CH11), the second contact hole (CH12), and the third contact hole (CH13) are overlapped with each other in the same sub pixel (SP1, SP2, SP3), a case in which at least one among the first contact hole (CH11), the second contact hole (CH12), and the third contact hole (CH13) is not overlapped with the remaining contact hole may facilitate a process of forming the contact hole (CH11~CH13, CH21~CH23, CH31~CH33), and also may decrease a size of the contact hole (CH11~CH13, CH21~CH23, CH31~CH33).

A structure of the contact hole (CH11~CH13, CH21~CH23, CH31~CH33) shown in FIG. 14 may be applied to a structure of FIGS. 2, 6, and 7. At this time, in the structure of FIGS. 2, 6, and 7, the fourth contact hole (CH14, CH24, CH34) may be overlapped with at least one among the first contact hole (CH11, CH21, CH31), the second contact hole (CH12, CH22, CH32), and the third contact hole (CH13, CH23, CH33) in the same sub pixel (SP1, SP2, SP3), or not.

Also, a structure of the contact area (CA1, CA2, CA3) shown in FIGS. 13 and 14 may be applied to the embodiment of FIG. 1.

Figure 15:
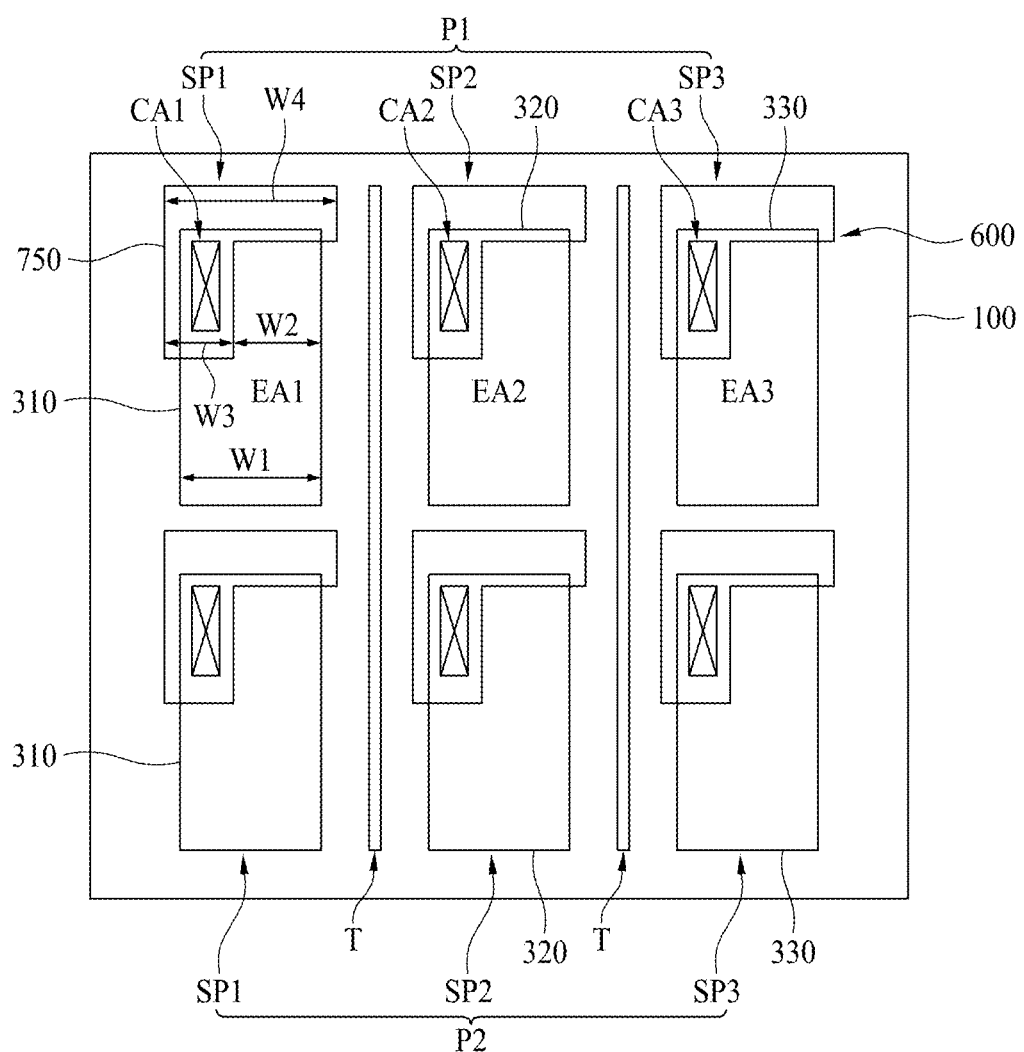
FIG. 15 is a schematic plan view illustrating an electroluminescent display device according to another embodiment of the present disclosure.

FIG. 15 is a schematic plan view illustrating an electroluminescent display device according to another embodiment of the present disclosure. In the electroluminescent display device of FIG. 15, a structure of a charge blocking layer 750 is changed based on changes of a structure of an emission area (EA1, EA2, EA3) and a structure of a contact area (CA1, CA2, CA3), whereby the electroluminescent display device of FIG. 15 is different from the electroluminescent display device of FIG. 11.

According to the aforementioned embodiment of FIG. 11, only one side of the first contact area (CA1) confronts the first emission area (EA1), only one side of the second contact area (CA2) confronts the second emission area (EA2), and only one side of the third contact area (CA3) confronts the third emission area (EA3). Accordingly, a width of a first portion of one charge blocking layer 750 overlapped with the first contact area (CA1) is identical to a width of a second portion of one charge blocking layer 750 overlapped with the boundary area between the neighboring first sub pixels (SP1). And, a width of a first portion of another charge blocking layer 750 overlapped with the second contact area (CA2) is identical to a width of a second portion of another charge blocking layer 750 overlapped with the boundary area between the neighboring second sub pixels (SP2). And a width of a first portion of the other charge blocking layer 750 overlapped with the third contact area (CA3) is identical to a width of a second portion of the other charge blocking layer 750 overlapped with the boundary area between the neighboring third sub pixels (SP3). The width indicates a length of a horizontal direction traversing the first sub pixel (SP1), the second sub pixel (SP2), and the third sub pixel (SP3).

Meanwhile, as shown in FIG. 15, two sides of the first contact area (CA1), and more particularly, lower and right sides of the first contact area (CA1) confront the first emission area (EA1), two sides of the second contact area (CA2), and more particularly, lower and right sides of the second contact area (CA2) confront the second emission area (EA2), and two sides of the third contact area (CA3), and more particularly, lower and right sides of the third contact area (CA3) confront the third emission area (EA3).

Accordingly, in case of FIG. 15, the emission area (EA1, EA2, EA3) includes a first portion positioned at a lower side of the contact area (CA1, CA2, CA3) and configured to have a relatively-large first width (W1), and a second portion positioned at a right side of the contact area (CA1, CA2, CA3) and configured to have a relatively-small second width (W2). Thus, each charge blocking layer 750 includes a first portion overlapped with the contact area (CA1, CA2, CA3) and configured to have a relatively-small third width (W3), and a second portion overlapped with the boundary area between the neighboring same sub pixels (SP1, SP2, SP3) and configured to have a relatively-large fourth width (W4).

In case of FIG. 11, the contact area (CA1, CA2, CA3) is provided along a horizontal direction at an upper side of the emission area (EA1, EA2, EA3) so that it is difficult to decrease a width of a horizontal direction of the contact area (CA1, CA2, CA3). Even though a width of a horizontal direction of the contact area (CA1, CA2, CA3) is provided to be smaller than a width of a horizontal direction of the emission area (EA1, EA2, EA3), a space which remains at a lateral side of the contact area (CA1, CA2, CA3) is small, whereby it is difficult to form the emission area (EA1, EA2, EA3) at the lateral side of the contact area (CA1, CA2, CA3). Accordingly, even though the width of the horizontal direction of the contact area (CA1, CA2, CA3) is decreased at maximum, it is difficult to increase a size of the emission area (EA1, EA2, EA3).

Meanwhile, in case of FIG. 15, the contact area (CA1, CA2, CA3) is provided along a vertical direction so that it is possible to provide the emission area (EA1, EA2, EA3) at a right side of the contact area (CA1, CA2, CA3). Especially, if a width of a vertical direction of the contact area (CA1, CA2, CA3) is decreased, it is possible to increase a size of the emission area (EA1, EA2, EA3) by the decreased width, to thereby improve an aperture ratio.

Meanwhile, according as the contact area (CA1, CA2, CA3) may be positioned at a right-sided upper end of the emission area (EA1, EA2, EA3), lower and left sides of the first contact area (CA1) may confront the first emission area (EA1), lower and left sides of the second contact area (CA2) may confront the second emission area (EA2), and lower and left sides of the third contact area (CA3) may confront the third emission area (EA3). The present disclosure may include a structure of FIG. 15 to which the trench (T) is not applied.

Figure 16:
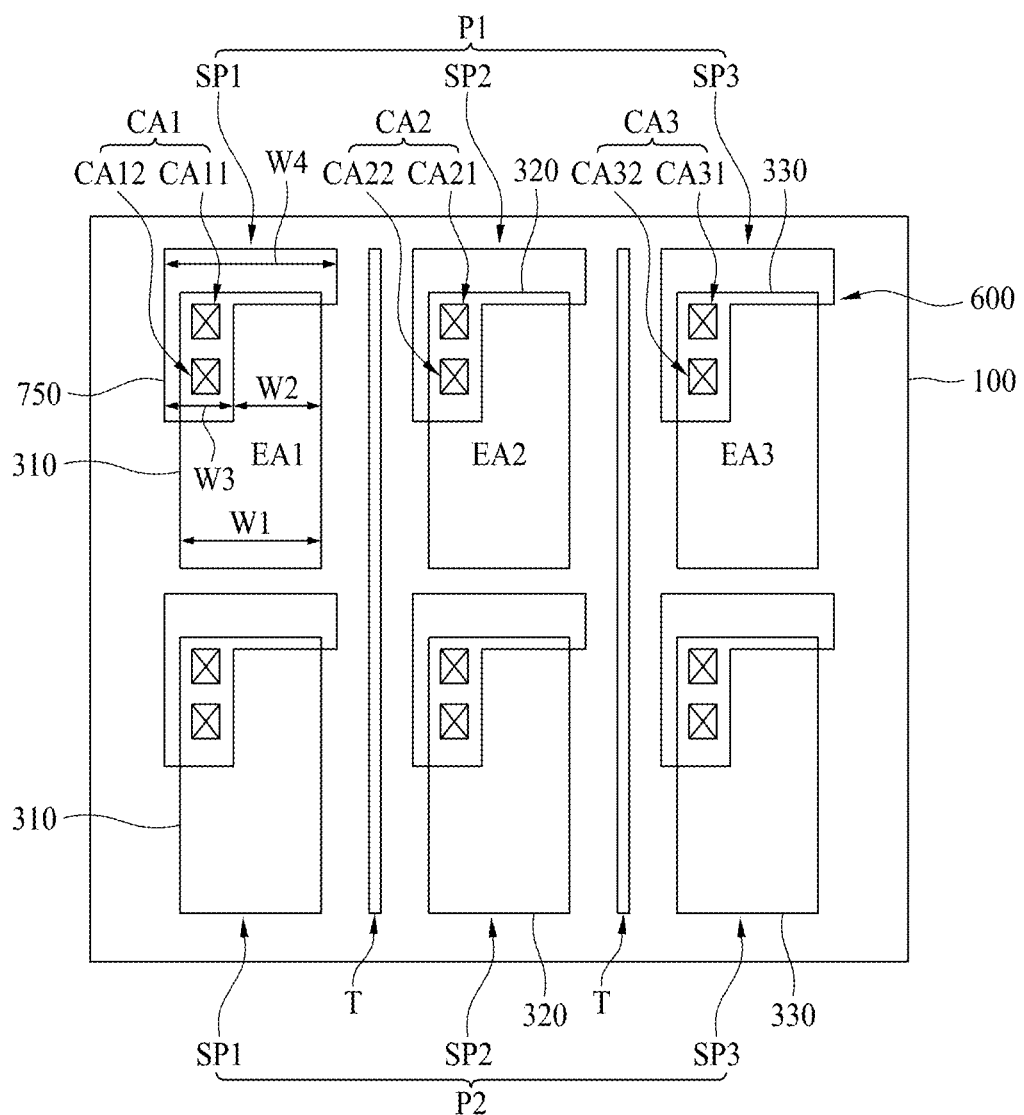
FIG. 16 is a schematic plan view illustrating an electroluminescent display device according to another embodiment of the present disclosure.

FIG. 16 is a schematic plan view illustrating an electroluminescent display device according to another embodiment of the present disclosure. The electroluminescent display device of FIG. 16 is different in structure of a contact area (CA1, CA2, CA3) from the electroluminescent display device of FIG. 15.

A first contact area (CA1) includes a first area (CA11) and a second area (CA12) which are spaced apart from each other. A second contact area (CA2) includes a first area (CA21) and a second area (CA22) which are spaced apart from each other. A third contact area (CA3) includes a first area (CA31) and a second area (CA32) which are spaced apart from each other. At least one contact hole is provided in the first area (CA11, CA21, CA3), and at least one contact hole may be provided in the second area (CA12, CA22, CA32).

A detailed cross section structure of the contact area (CA1, CA2, CA3) is identical to that of FIG. 14, whereby a detailed description for the cross section structure of the contact area (CA1, CA2, CA3) will be omitted.

Figure 17A:
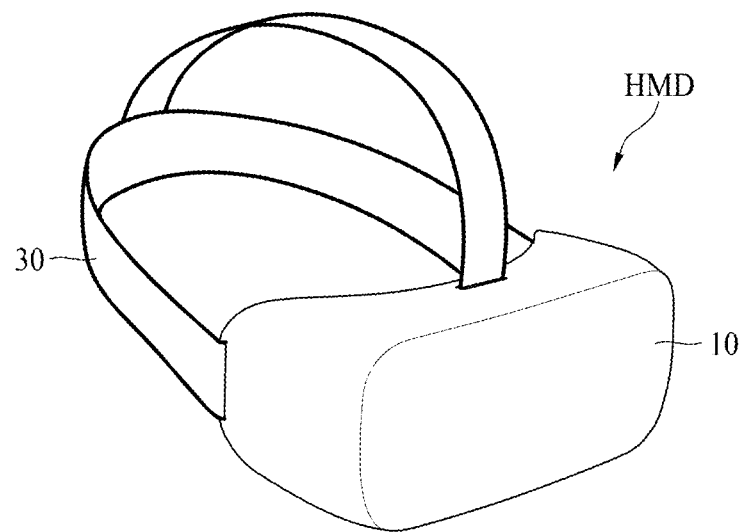
FIGS. 17A to 17C relate an electroluminescent display device according to another embodiment of the present disclosure.
Figure 17B:
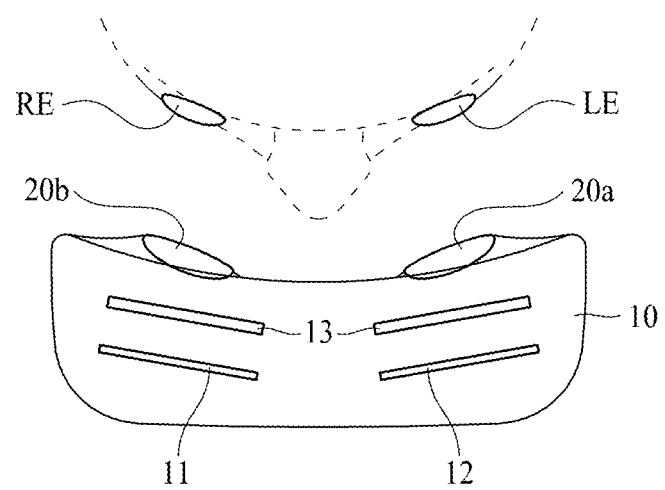
Figures 17C, 18:
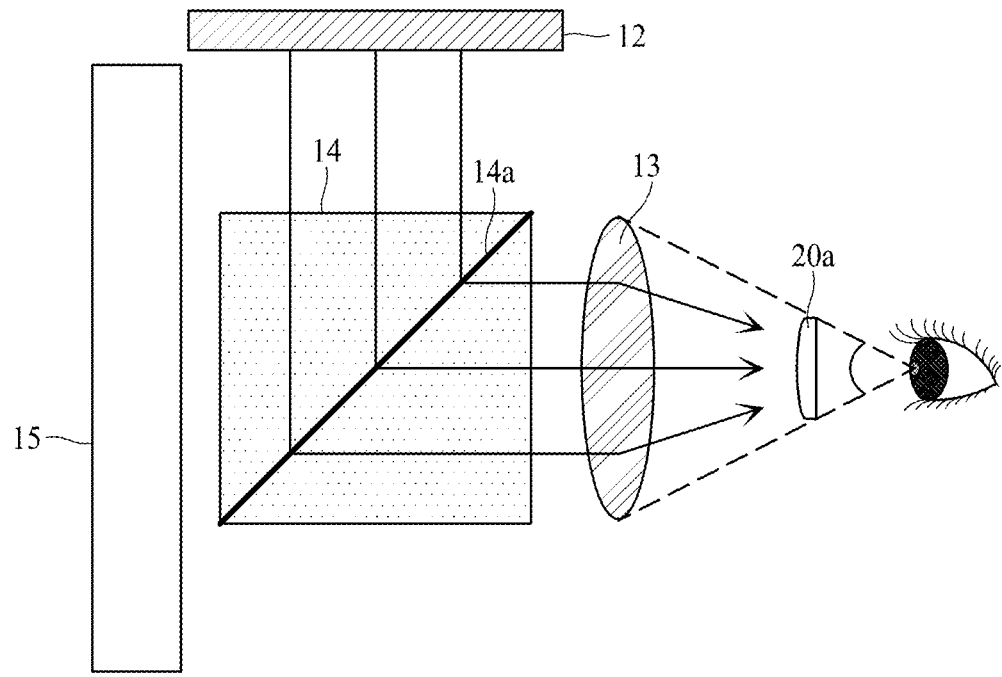
FIG. 18 is a table showing the color coordinates by each gray scale (G) and CIE1976 overlap ratio in the comparative example 1 and the embodiment of the present disclosure.

FIGS. 17A to 17C relate to an electroluminescent display device according to another embodiment of the present disclosure and relate to a head-mounted display (HMD) apparatus. FIG. 17A is a schematic perspective view, FIG. 17B is a schematic plan view of a virtual reality (VR) structure, and FIG. 17C is a schematic cross-sectional view of an augmented reality (AR) structure.

As seen in FIG. 17A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface and both side surfaces of a user, but is not limited thereto. The head-mounted band 30 may fix the HMD apparatus to a head of a user and may be replaced by a glasses frame type structure or a helmet type structure.

As seen in FIG. 17B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display device as explained above. In this case, an upper portion (for example, a color filter layer 910, 920, and 930) corresponding to a surface displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 17C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 17C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display device as explained above. In this case, an upper portion (for example, a color filter layer 910, 920, and 930) corresponding to a surface displaying an image may face the transmissive reflection part 14.

The lens array 13 may be provided between the left-eye eyepiece lens 20a and the transmissive reflection part 14.

The left eye of the user may be located at the left-eye eyepiece lens 20a.

The transmissive reflection part 14 may be disposed between the lens array 13 and the transmissive window 15. The transmissive reflection part 14 may include a reflection surface 14a which transmits a portion of light and reflects the other portion of the light. The reflection surface 14a may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

FIG. 18 is a table showing the color coordinates by each gray scale (G) and CIE1976 overlap ratio in the comparative example 1 and the embodiment of the present disclosure. In FIG. 18, the comparative example 1 has a structure obtained by omitting the charge blocking layer 750 from the structure of FIG. 1, and the embodiment of the present disclosure has a structure of FIG. 1, which will be identically applied to FIGS. 19A, 19B, and 20. In this case, values of the color coordinates shown in FIG. 18 are the relative values of the color coordinates of 191G to 15G based on a standard reference point (0) of 255G in the comparative example 1 and the embodiment of the present disclosure.

As shown in FIG. 18, in case of the comparative example 1 and the embodiment of the present disclosure, the change of color coordinates by each grayscale (G) is shown in each of red (R) pixel, green (G) pixel, and blue (B) pixel.

In detail, in case of the embodiment of the present disclosure, at the standard reference point of 255G, the CIE1976 overlap ratio is 91.0%. According as the CIE1976 overlap ratio is lowered in accordance with the decrease of grayscale, the CIE1976 overlap ratio at 15G is lowered to 59.1%.

Meanwhile, in case of the comparative example 1, the CIE1976 overlap ratio is 77.3% at the standard reference point of 255G, and the CIE1976 overlap ratio at 15G is lowered to 19.8%. In comparison to the CIE1976 overlap ratio in the embodiment of the present disclosure, the CIE1976 overlap ratio in the comparative example 1 is remarkably lowered.

Accordingly, in comparison to the comparative example 1 without the charge blocking layer 750, the embodiment comprising the charge blocking layer 750 realizes the decreased change of color coordinates by each grayscale (G).

Figure 19A:
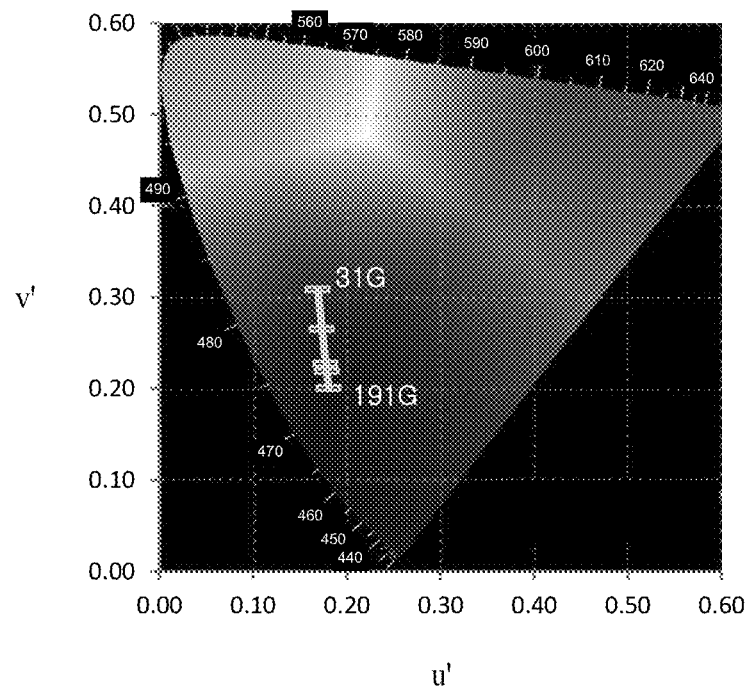
FIG. 19A shows the change of color coordinates by each grayscale in the blue pixel according to the comparative example 1.
Figure 19B:
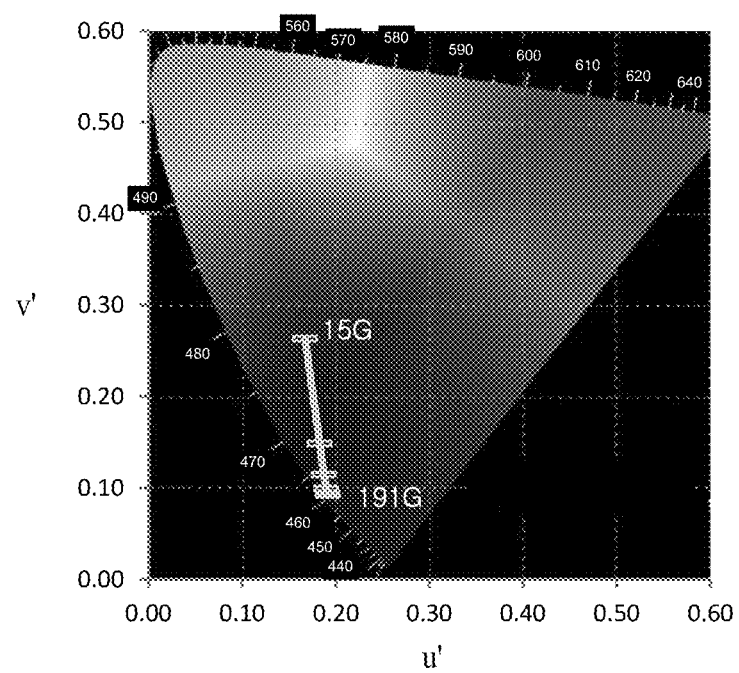
FIG. 19B shows the change of color coordinates by each grayscale in the blue pixel according to the embodiment of the present disclosure.

FIG. 19A shows the change of color coordinates by each grayscale in the blue pixel according to the comparative example 1, and FIG. 19B shows the change of color coordinates by each grayscale in the blue pixel according to the embodiment of the present disclosure.

As shown in FIG. 19A, in case of the comparative example 1, a vertical axis (v') value at 191G is 0.20, which is out of a range of a deep blue. According as a grayscale (G) is lowered, a deviation degree becomes serious. Thus, a vertical axis (v') value at 31G is more than 0.30.

Meanwhile, as shown in FIG. 19B, in case of the embodiment of the present disclosure, a vertical axis (v') value at 191G is 0.10, which is not significantly far from a range of a deep blue. According as a grayscale (G) is lowered, a deviation degree is slightly increased. However, a vertical axis (v') value at 15G is less than 0.30.

Accordingly, in case of the embodiment of the present disclosure, the change of color coordinates by each grayscale in the blue pixel is decreased as compared with that of the comparative example 1.

Figure 20:
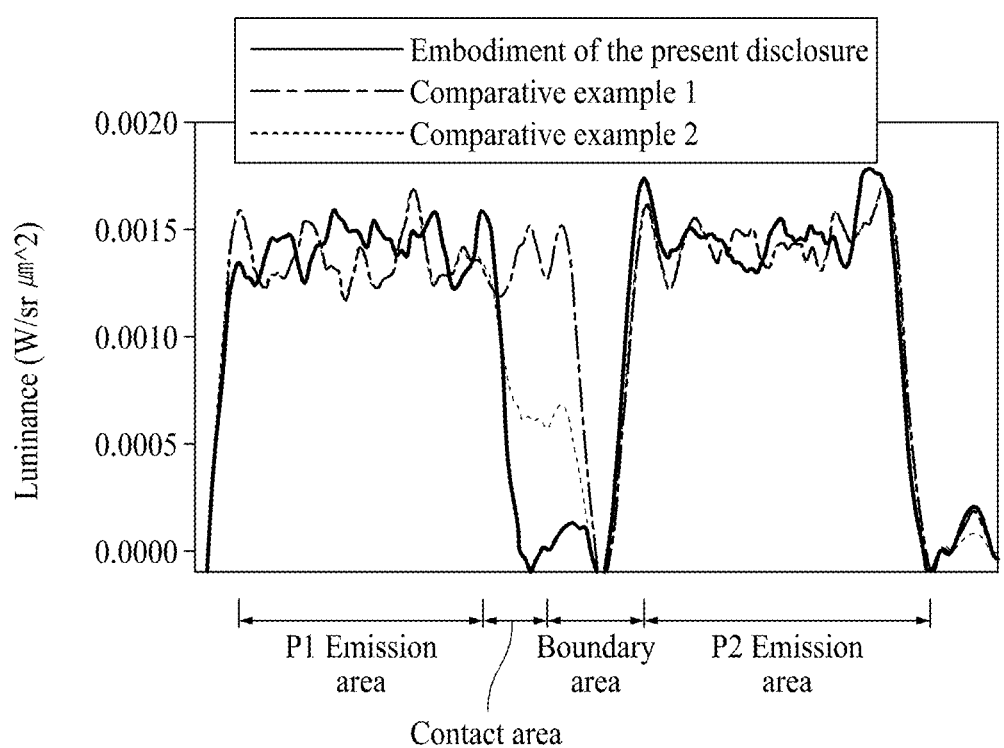
FIG. 20 is a graph showing a luminance change by each position in the comparative examples 1 and 2 and the embodiment of the present disclosure.

FIG. 20 is a graph showing a luminance change by each position in the comparative examples 1 and 2 and the embodiment of the present disclosure. The comparative example 2 of FIG. 20 illustrates a structure obtained by providing a light shielding layer on a first color filter 910 instead of the charge blocking layer 750 in the structure of FIG. 1. In the same manner as the charge blocking layer 750 of FIG. 1, the light shielding layer is overlapped with the first contact area (CA1) and the boundary area between the neighboring first sub pixels (SP1).

As shown in FIG. 20, in case of the comparative example 1, a luminance in the contact area (CA) and the boundary area between the neighboring pixels (P1, P2) is similar to a luminance in the emission area of the individual pixel (P1, P2). Thus, in case of the comparative example 1, there is a large leakage current in the contact area (CA) and the boundary area between the neighboring pixels (P1, P2).

In case of the comparative example 2, a luminance in the contact area (CA) and the boundary area between the neighboring pixels (P1, P2) is about ½ of a luminance in the emission area of the individual pixel (P1, P2).

Meanwhile, in case of the embodiment of the present disclosure, a luminance in the contact area (CA) and the boundary area between the neighboring pixels (P1, P2) is close to '0'.

Accordingly, a leakage current in the contact area (CA) and the boundary area between the neighboring pixels (P1, P2) according to the embodiment of the present disclosure is lowered, as compared to the comparative examples 1 and 2.

According to one embodiment of the present disclosure, the charge blocking layer is overlapped with the contact area so that it is possible to prevent a problem related with a light emission caused by a leakage current in the contact area.

According to one embodiment of the present disclosure, the charge blocking layer is overlapped with the boundary area between the neighboring sub pixels configured to emit the same colored light so that it is possible to prevent a problem related with a light emission caused by a leakage current in the boundary area.

According to another embodiment of the present disclosure, the trench is provided in the boundary area between the neighboring sub pixels configured to emit the different colored light, whereby at least a portion of the emission layer in the trench area may be disconnectedly provided. Thus, it is possible to prevent a leakage current in the area between the neighboring sub pixels, and to prevent a problem related with a deterioration of picture quality caused by the leakage current.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. An electroluminescent display device comprising:
a first pixel and a second pixel, wherein each of the first pixel and the second pixel includes a first sub pixel configured to emit first colored light, a second sub pixel configured to emit second colored light, and a third sub pixel configured to emit third colored light;
a first electrode in each of the first sub pixel, the second sub pixel, and the third sub pixel;
an emission layer on the first electrode;
a second electrode on the emission layer; and
a charge blocking layer including a first charge blocking layer provided in an area overlapped with a boundary area between the first sub pixel of the first pixel and the first sub pixel of the second pixel, a second charge blocking layer provided in an area overlapped with a boundary area between the second sub pixel of the first pixel and the second sub pixel of the second pixel, and a third charge blocking layer provided in an area overlapped with a boundary area between the third sub pixel of the first pixel and the third sub pixel of the second pixel.

2. The electroluminescent display device according to claim 1, wherein the first charge blocking layer, the second charge blocking layer, and the third charge blocking layer are spaced apart from each other without being in contact with each other.

3. The electroluminescent display device according to claim 1, wherein the first charge blocking layer, the second charge blocking layer, and the third charge blocking layer are provided below the second electrode and are configured to prevent an electron generated in the second electrode from being transferred to the emission layer.

4. The electroluminescent display device according to claim 1, wherein the emission layer includes a first stack having a first emission layer, a second stack having a second emission layer, and a charge generation layer provided between the first stack and the second stack,
wherein each of the first charge blocking layer, the second charge blocking layer, and the third charge blocking layer is provided between the second emission layer and the second electrode.

5. The electroluminescent display device according to claim 1, wherein the first charge blocking layer extends to a first contact area in the first sub pixel of the second pixel, the second charge blocking layer extends to a second contact area in the second sub pixel of the second pixel, and the third charge blocking layer extends to a third contact area in the third sub pixel of the second pixel.

6. The electroluminescent display device according to claim 1, wherein the first charge blocking layer is not overlapped with a first emission area of the first sub pixel of the second pixel, the second charge blocking layer is not overlapped with a second emission area of the second sub pixel of the second pixel, and the third charge blocking layer is not overlapped with a third emission area of the third sub pixel of the second pixel.

7. The electroluminescent display device according to claim 1, further comprising a lens array on the second electrode, and a receiving case for accommodating the lens array.

* * * * *